US007492020B2

(12) United States Patent
Suzuki

(10) Patent No.: US 7,492,020 B2
(45) Date of Patent: Feb. 17, 2009

(54) MICRO STRUCTURE WITH INTERLOCK CONFIGURATION

(75) Inventor: Tamito Suzuki, Fukuroi (JP)

(73) Assignee: Yamaha Corporation, Shizuoka-ken (JP)

( * ) Notice: Subject to any disclaimer, the term of this patent is extended or adjusted under 35 U.S.C. 154(b) by 0 days.

(21) Appl. No.: 11/247,193

(22) Filed: Oct. 12, 2005

(65) Prior Publication Data

US 2006/0038301 A1    Feb. 23, 2006

Related U.S. Application Data

(62) Division of application No. 10/902,390, filed on Jul. 30, 2004, now Pat. No. 7,071,017.

(30) Foreign Application Priority Data

| Aug. 1, 2003 | (JP) | ............................. 2003-205411 |
| Sep. 5, 2003 | (JP) | ............................. 2003-314546 |
| Sep. 5, 2003 | (JP) | ............................. 2003-314547 |
| May 28, 2004 | (JP) | ............................. 2004-159017 |

(51) Int. Cl.
*H01L 29/04* (2006.01)
*H01L 31/036* (2006.01)
*H01L 29/82* (2006.01)
*H01L 23/48* (2006.01)
*H01L 29/40* (2006.01)

(52) U.S. Cl. ........................... 257/415; 257/50; 257/52; 257/774

(58) Field of Classification Search ................. 257/415, 257/50, 53, 774, 775, 776
See application file for complete search history.

(56) References Cited

U.S. PATENT DOCUMENTS

| 5,943,155 | A | * | 8/1999 | Goossen ..................... 359/247 |
| 6,028,331 | A | * | 2/2000 | Mastromatteo et al. ..... 257/253 |
| 6,337,268 | B1 | * | 1/2002 | Kido et al. .................. 438/618 |
| 6,649,517 | B2 | * | 11/2003 | Teh et al. .................... 438/640 |
| 2003/0180981 | A1 | | 9/2003 | Ishibashi et al. |

FOREIGN PATENT DOCUMENTS

| JP | 10-190008 | 7/1998 |
| JP | 2001-121499 | 5/2001 |
| WO | WO-02/02458 A1 | 1/2002 |
| WO | WO-02/103808 | 12/2002 |
| WO | WO-03/015183 A1 | 2/2003 |

OTHER PUBLICATIONS

Biebl, M., et al.; "In Situ Phosphorus-Doped Polysilicon for Integrated MEMS"; The 8th International Conference on Solid-State Sensors and Actuators, and Eurosensors IX; Stockholm, Sweden; Jun. 25-29, 1995; pp. 196-201.
Esasi, Masayosi,; "Micro Machine"; Industrial Technology Information Service Center Ltd., pp. 55-56.

* cited by examiner

*Primary Examiner*—Chuong A. Luu
(74) *Attorney, Agent, or Firm*—Dickstein Shapiro LLP

(57) ABSTRACT

A micro structure has: a semiconductor substrate; an insulating film having a via hole and formed on the semiconductor substrate; an interlock structure formed on a side wall of the via hole and having a retracted portion and a protruded portion above the retracted portion; a conductive member having at one end a connection portion formed burying the via hole and an extension portion continuous with the connection portion and extending along a direction parallel to a surface of the semiconductor substrate.

20 Claims, 27 Drawing Sheets

MICRO STRUCTURE WITH INTERLOCK CONFIGURATION

CROSS REFERENCE TO RELATED APPLICATION

This is a division of application Ser. No. 10/902,390, filed Jul. 30, 2004 now U.S. Pat. No. 7,071,017 and further claims priorities of Japanese Patent Applications No. 2003-205411 filed on Aug. 1, 2003, No. 2003-314546 and No. 2003-314547 both filed on Sep. 5, 2003, and No. 2004-159017 filed on May 28, 2004. The entire contents of each of the above-referenced applications are incorporated herein by reference.

BACKGROUND OF THE INVENTION

A) Field of the Invention

The present invention relates to a micro structure suitable for use in a micro-electro-mechanical system (MEMS).

B) Description of the Related Art

As a micro structure, an acceleration sensor is known having a parallel plate capacitor formed on a silicon substrate (e.g., refer to Japanese Patent Laid-open Publication No. 2001-121499 (U.S. Ser. No. 09/395,711 filed on Sep. 5, 2000) which is incorporated herein by reference).

According to this prior art, a fixed electrode and a movable electrode constituting a parallel plate capacitor are both made of a polysilicon layer whose portion is fixed to a contact column (via). It is not easy, however, to firmly fix a polysilicon layer by only the bottom surface of the contact column.

FIG. 30 shows a micro structure formed during studies by the present inventor. On one principal surface of a semiconductor substrate 1 made of, for example, single crystal silicon, a first silicon oxide film 2, a silicon nitride film 3 and a second silicon oxide film 4 are formed having thicknesses of 10 to 100 nm, 50 to 100 nm, 1 to 5 μm, respectively. The silicon oxide film 2 is used as a pad film, the silicon nitride film 3 is used as an etching stopper film, and the silicon oxide film 4 is used as a sacrificial film.

A via hole 5a is formed through the silicon oxide film 4 by anisotropic etching. By continuing the anisotropic etching, a via hole 5b continuous with the via hole 5a is formed through the stack layer of the silicon oxide film 2 and silicon nitride film 3. A conductive polysilicon layer of 2 to 5 μm in thickness is deposited on the silicon oxide film 4, burying the via holes 5a and 5b, and thereafter the deposited layer is patterned by a selective etching process to form an electrode (or wiring line) 6.

Thereafter, the silicon oxide film 4 is etched and removed as shown in FIG. 31. The electrode 6 can therefore be used as a movable electrode of a cantilever type as indicated by a broken line. This connection structure has a weak connection force between the electrode 6 and substrate 1 so that the electrode 6 is likely to fall out of the via hole 5b. In the case that the electrode 6 is used as a fixed electrode (or wiring line) in the state of this connection structure shown in FIG. 30 (in the state that the silicon oxide film 4 remains unremoved), the electrode 6 falls off the via holes 5a and 5b in some cases by a film stress or the like.

According to a known method of manufacturing a cantilever made of polysilicon, impurities such as phosphorus are doped in situ into polysilicon in order to suppress camber of the cantilever while polysilicon is deposited, and thereafter a rapid thermal annealing (RTA) process is performed to relax stress in the deposited polysilicon layer (for example, refer to "In situ Phosphorus-doped Polysilicon for Integrated MEMS", M. Bieble, G. T. Mulhern and R. T. Howe, the 8-th International Conference on Solid-State Sensors and Actuators, and Eurosensors IX. Stockholm, Sweden, Jun. 25-29, 1995, pp. 198-201).

According to the above-described prior art, phosphorus is doped into polysilicon at the concentration range of a phosphorus/silicon mol ratio of 0.00016 to 0.01. It is difficult, however, to sufficiently suppress camber of the cantilever.

FIG. 32 shows a micro structure formed during studies by the present inventor. On one principal surface of a semiconductor substrate 1 made of, for example, single crystal silicon, a silicon oxide film 2, a silicon nitride film 3 and a silicon oxide film 4 are stacked. The silicon oxide film 2 is used as a pad film, the silicon nitride film 3 is used as an etching stopper film, and the silicon oxide film 4 is used as a sacrificial film.

A via hole 5a is formed through the silicon oxide film 4 by isotropic etching, and thereafter a via hole 5b continuous with the bottom of the via hole 5a is formed through the stack layer of the silicon oxide film 2 and silicon nitride film 3 by anisotropic etching. Conductive polysilicon doped with phosphorus or the like is deposited on the silicon oxide film 4, and thereafter the polysilicon deposited layer is patterned by a selective etching process to form a conductive member 6. Before or after the polysilicon deposited layer is patterned, the polysilicon deposited layer is subjected to an RTA process to relax stress.

Thereafter, the silicon oxide film 4 is etched and removed. The conductive member 6 has a connection portion 6P connected to connection region 1a of the substrate 1 via the via hole 5b and an extension portion 6Q extending over and spaced from the silicon nitride film 3. The conductive member 6 can be used as a movable electrode of a cantilever type of, for example, an acceleration sensor having a parallel plate type capacitor.

With the cantilever structure having the above-described conductive member 6, the extension portion 6Q may warp upward as indicated by an arrow A shown in FIG. 32, may warp downward as indicated by an arrow B shown in FIG. 33 causing sticking the surface layer of the substrate, or may twist as indicated by an arrow C shown in FIG. 34. These warp and twist of the extension portion 6Q are considered based upon residual stress in the polysilicon deposited layer.

A Bosch method of alternately repeating isotropic etching and film deposition is known as a selective dry etching method for thick silicon (for example, refer to "Micro Machine", Masayosi ESASI, Industrial Technology Information Service Center Ltd, pp. 55-56).

Since the Bosch method uses isotropic etching, the side walls are not vertical (isotropic). New facilities are required to be introduced, resulting in a cost rise.

With a dry etching method using as etching gas a mixture gas of $Cl_2$ or HBr gas, and $O_2$ gas, an etching rate is slow so that lower productivity cannot be avoided when thick silicon is etched. The side walls are not vertical but have a normal taper shape. It is difficult to have a good isotropic shape.

SUMMARY OF THE INVENTION

An object of this invention is to provide a micro structure and its manufacture method capable of preventing a conductive member such as an electrode and a wiring line from falling out of a via hole.

According to one aspect of the present invention, there is provided a micro structure comprising: a semiconductor substrate; an insulating film having a via hole and formed on the semiconductor substrate; an interlock structure formed on a side wall of the via hole and having a retracted portion and a protruded portion above the retracted portion; and a conductive member having at one end a connection portion formed burying the via hole and an extension portion continuous with the connection portion and extending along a direction parallel to a surface of the semiconductor substrate.

According to another aspect of the present invention, there is provided a micro structure manufacture method comprising steps of: (a) forming an insulating film on a semiconductor substrate, the insulating film including a lower layer and an upper layer; (b) forming a sacrificial film on the insulating film; (c) forming a via hole through the sacrificial film and the insulating film; (d) forming an interlock mechanism on a side wall of the via hole, the interlock mechanism including a retracted portion and a protruded portion above the retracted portion; (e) depositing a conductive film on the sacrificial film, the conductive film burying the via hole; and (f) patterning the conductive film.

As above, the interlock structure of a via hole and an connection portion of the conductive member constitutes a strong mechanical interlock structure. It is possible to suppress the conductive member from falling out of the via hole.

DESCRIPTION OF THE PREFERRED EMBODIMENTS

Figure 1:
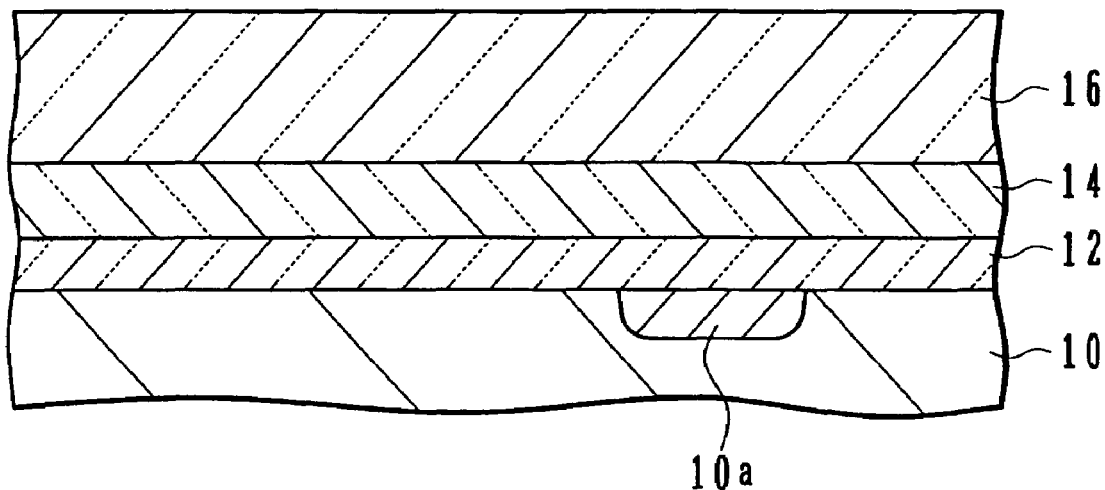
FIGS. 1 to 6 are cross sectional views illustrating main processes of a micro structure manufacture method according to an embodiment of the present invention.

FIGS. 1 to 6 are cross sectional views illustrating main processes of a micro structure manufacture method according to an embodiment of the present invention. Processes (1) to (6) illustrated in FIGS. 1 to 6 will be described in this order.

(1) On one principal surface of a semiconductor substrate 10 made of, for example, single crystal silicon, a connection region 10a is formed. On the principal surface, a first insulating film 12, a second insulating film 14 and a third insulating film 16 are stacked sequentially. For example, the connection region 10a is an n-type and is formed in a p-type region. The insulating film 12 is used as a pad film, and made of, for example, a silicon oxide film having a thickness of 150 to 300 nm, more preferably 200 to 250 nm. This silicon oxide film is formed by a thermal oxidation method although it may be formed by a chemical mechanical deposition (CVD) method or the like.

Figure 42:
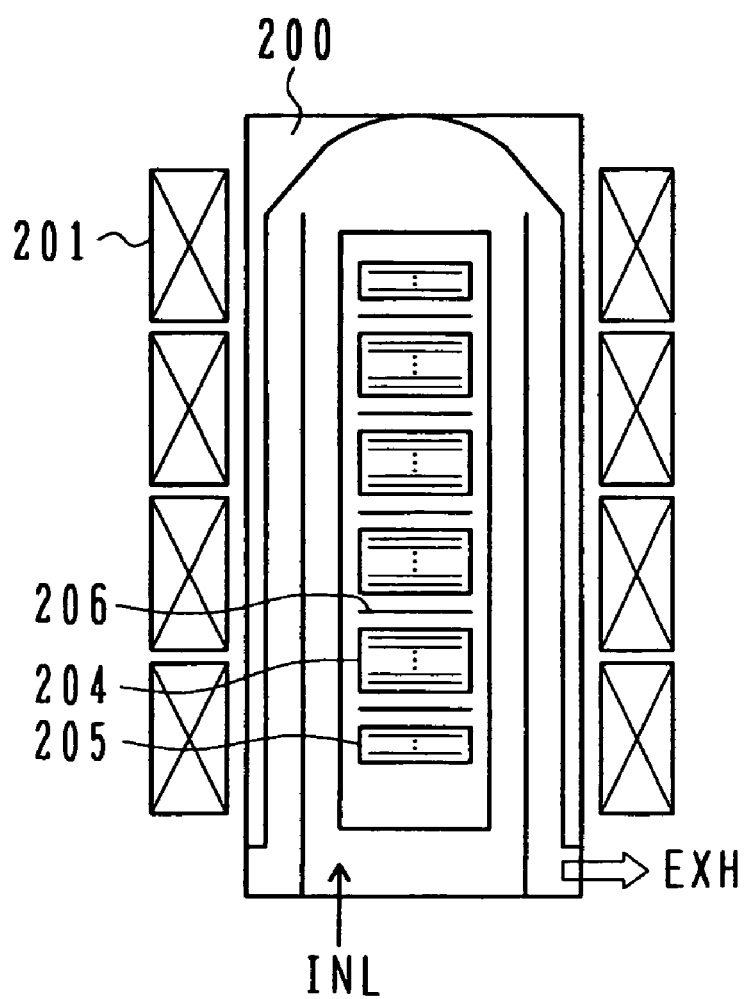
FIG. 42 is a schematic diagram of the structure of a CVD system.

FIG. 42 schematically shows the structure of a CVD system. In a hermetic chamber 200, four wafer susceptors 204, each for 25 wafers, are positioned. Two side dummy susceptors 205 are provided at the upper and the lower sides of the wafer susceptors 204. Monitor is inserted between each adjacent pair of susceptors 204 and 205, for monitoring the thickness and the resistance etc. of the deposited film. Heaters 201 are installed around the chamber 200 to heat the inside of the chamber. Gas inlet INL introduces selected gases, and the exhaust port EXH exhausts the gases.

The insulting film 14 is used as an etching stopper film, and made of, for example, a silicon nitride film having a thickness of 100 to 200 nm. This silicon nitride film is formed by a CVD method or the like. The insulating film 16 is used as a sacrificial film, and made of, for example, a silicon oxide film having a thickness of 1 to 5 µm. This silicon oxide film is formed by a CVD method or the like.

(2) A resist pattern Ra having an opening above the connection region 10a is formed on the insulating film 16 by a photolithography process. By using the resist pattern Ra as a mask, a via hole 18a is formed through the insulating film 16 by isotropic etching. The isotropic etching amount is preferably about 40 to 60% of the thickness of the insulating film 16. This etching amount corresponds to 600 to 900 nm if the thickness of the insulating film 16 is 1.5 µm. For example, isotropic etching is performed to a depth of 750 nm. The maximum value of the isotropic etching amount is set to about 80% of the thickness of the insulating film 16 so that etching will not penetrate through the insulating film 16 even if there is a process variation.

Next, by using the resist pattern Ra as a mask, via holes 18a', 18b and 18c are formed through the remaining thickness of the insulating film 16 and the whole thicknesses of the insulating layers 14 and 12 by an anisotropic etching process such as reactive ion etching (RIE). The size of the via hole 18a' becomes smaller than that of the via hole 18a at its top. The via holes 18a', 18b and 18c are formed through the insulating film stacked layer, gradually reducing their sizes. Although the via hole 18c is formed shallowly entering the substrate, this structure is not substantial. The resist pattern Ra is removed thereafter. A via hole 18a of a wine glass shape is formed being constituted of the via holes 18a', 18b and 18c. As the isotropic etching amount is changed, the size of the via hole 18a changes.

Figure 6:
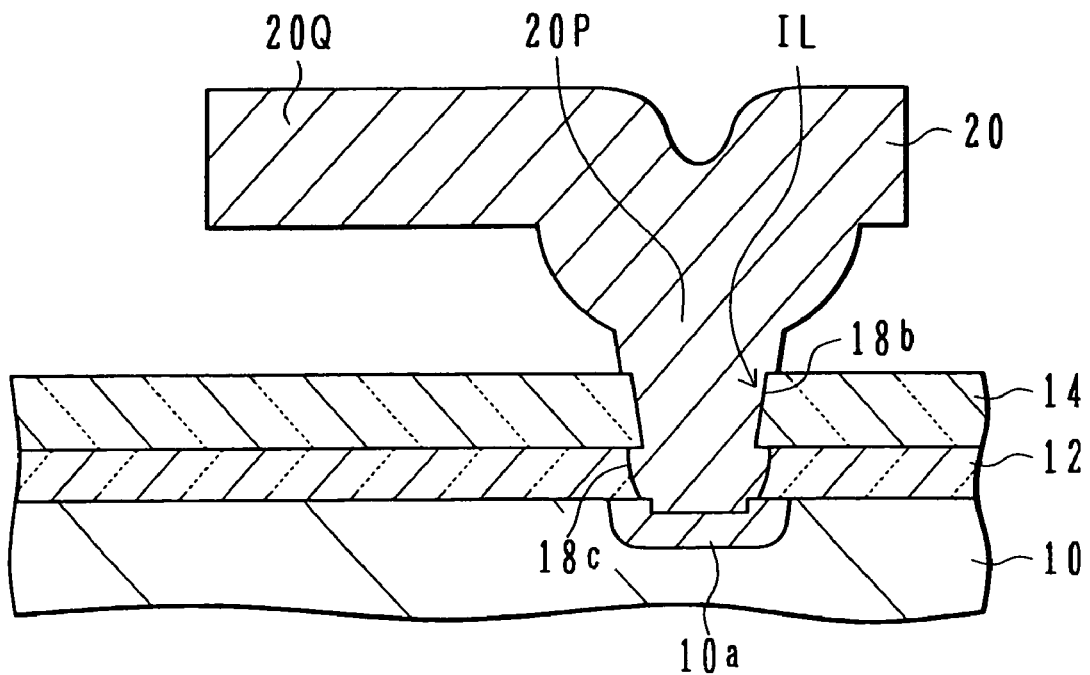

The size of the via hole 18a can be set in accordance with the size and length of an extension portion 20Q (corresponding to a beam) shown in FIG. 6. For example, if the extension portion 20Q is long, or large and heavy, it is effective to make the size of the via hole 18a large to increase a mechanical strength.

(3) The substrate 10 is immersed in chemical liquid to perform isotropic etching of silicon oxide. The insulating film 12 is side-etched and an undercut Ua is formed under the insulating film 14. The insulating film 16 is also side-etched and a retardation R generally equal to the undercut is formed on the side wall. The sizes of the via holes 18a' and 18c increase by an amount corresponding to the undercut Ua and retardation R. The side etch amount $U_1$ is set to, for example, 5 to 100 nm. The insulating film 14 of silicon nitride is hardly etched. In other words, a protrusion of the nitride film is formed at the intermediate position between the via holes in silicon oxide.

The chemical liquid immersing process uses as the chemical liquid, for example, 130 buffered hydrofluoric acid at a liquid temperature of 25 ±5° C. The side etch amount is determined by the etching rate and immersing time of the insulating films 12 and 16. If a thermal oxidation silicon oxide film is immersed in 130 buffered hydrofluoric acid for 50 seconds, a side etch amount $U_1$ of 45 nm is obtained. A side etch amount equal to or larger than 45 nm is obtained for a CVD oxide film. Other usable chemical liquids include 63 buffered hydrofluoric acid, straight hydrofluoric acid, hydrofluoric acid diluted with deionized water to a desired density, and the like. The above-described wet etching process can suppress the growth of a natural oxide film on the surface of the n-type region 10a exposed on the bottom of the via hole. Therefore, in a polysilicon deposition process shown in FIG. 4A, an adhesion performance between the n-type region 10a and polysilicon becomes good. Instead of wet etching, dry etching by a chemical dry etcher may be used as isotropic etching.

After the chemical liquid immersing process, the chemical liquid is replaced with deionized water and the substrate 10 is immersed in the deionized water. The immersing time is, for example, 30 minutes. Thereafter, the substrate 10 is pulled out of the deionized water and subjected to a drying process. For example, the drying process may use isopropyl alcohol vapor drying or Marangoni drying (lifting a workpiece from pure water into isopropyl alcohol vapor atomosphere).

(4) Immediately after the drying process, a conductive polysilicon layer 20A having a thickness of 1 to 10 μm (preferably 2 to 5 μm) is formed by CVD on the upper surface of the substrate, burying the via holes 18a', 18b and 18c and the insulating film 16. The polysilicon layer 20A is made of polysilicon doped with conductive type imparting impurities such as phosphorus (or boron) same as the conductivity type of the connection region 10a. A CVD system to be used is preferably a system having a natural oxide film growth suppressing mechanism such as a load lock mechanism. The polysilicon layer 20A is deposited burying also the under cut Us and filled in the via holes. An interlock structure that the polysilicon layer conformal to the undercut Ua and retardation R squeezes the protrusion of the insulating layer 14, is formed so that a strong mechanical strength is presented. As described above, as the natural oxide film is suppressed from being grown on the surface of the connection region 10a in the above-described chemical liquid process and CVD, the polysilicon layer 20A is electrically and mechanically connected to the connection region 10a in a good adhesion state.

Figure 4A:
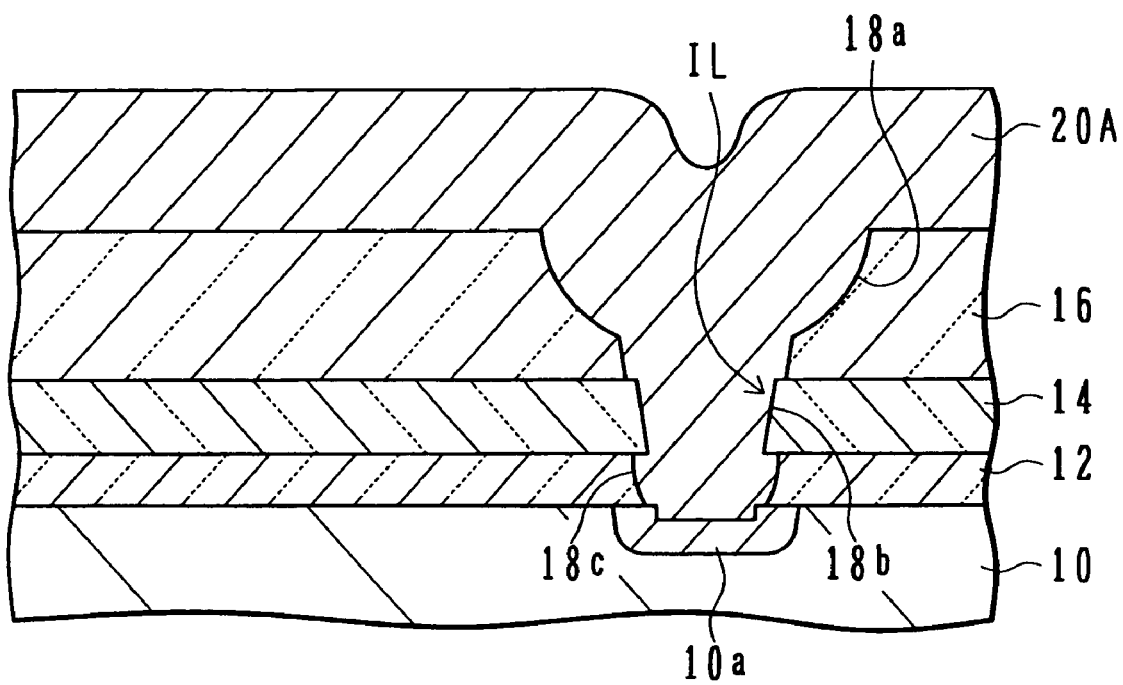
Figure 4B:
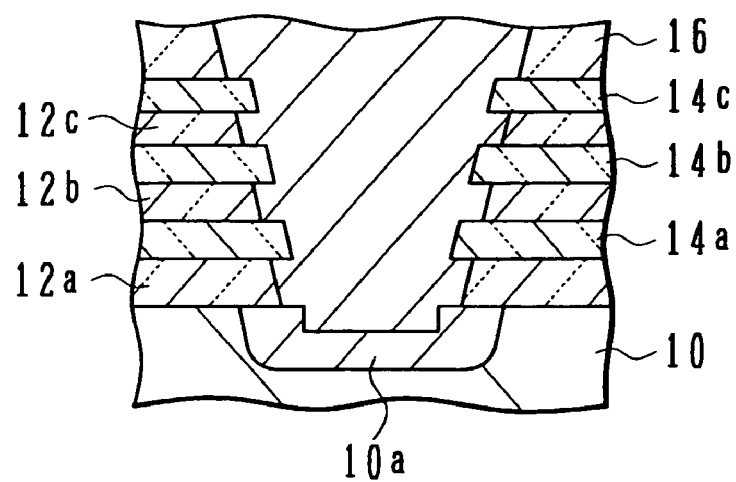

As shown in FIG. 4B, an oxide film 12 and a nitride film 14 may be stacked alternately and thereafter an insulating film 16 is formed. In the example shown in FIG. 4B, three oxide films 12a, 12b and 12c and three nitride films 14a, 14b and 14c are alternately stacked and thereafter a thick oxide film 16 is formed. The number of alternate stacks is not limited to three. The interlock structure having a plurality of protrusions is formed so that the mechanical strength can be reinforced.

(5) By using a resist pattern as a mask and a selective dry etching process, the polysilicon layer 20A is patterned to form a conductive member 20. The conductive member 20 has a connection portion 20P connected to the connection region 10a of the substrate 10 via the via holes 18a', 18b and 18c and an extension portion 20Q being continuous with the upper region of the connection portion and extending on the insulating film 16.

(6) The insulating film 16 is removed by wet etching. During this process, the insulating film 14 functions as the etching stopper film. The conductive member 20 enters therefore the state that it is lifted by the connection portion 20P connected to the connection region 10a of the substrate 10 and has the extension portion 20Q spaced from and extending above the surface of the insulating film 14.

Figure 5:
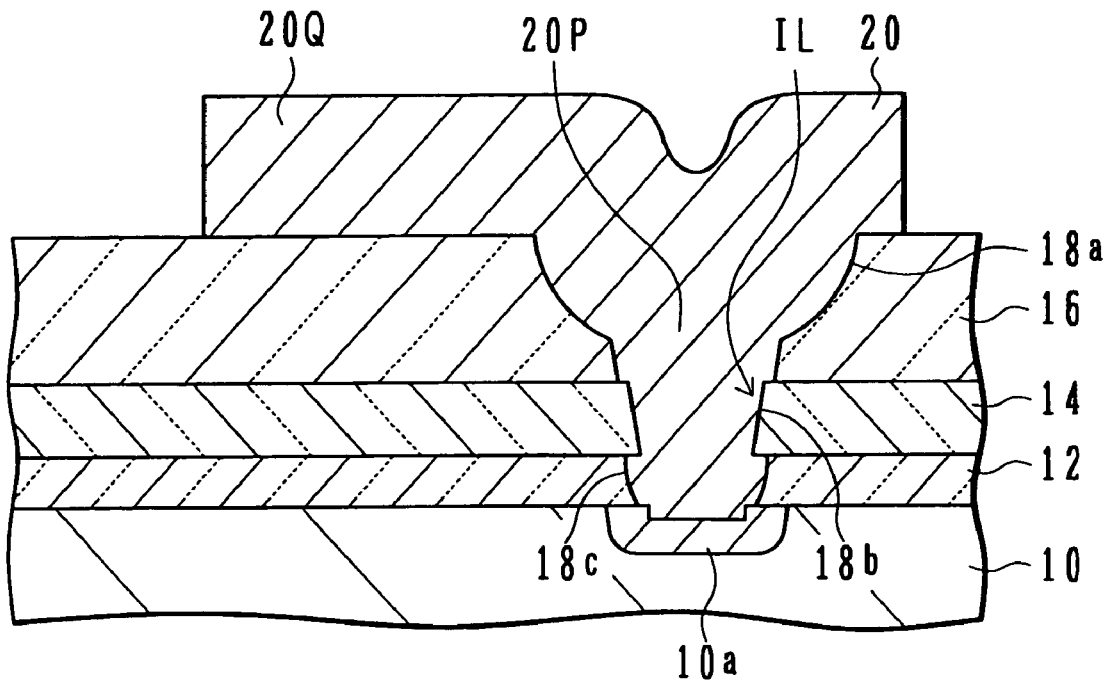

The conductive member 20 of the micro structure shown in FIG. 5 may be used as a fixed electrode or wiring line. The conductive member 20 of the micro structure shown in FIG. 6 is elastic and may be used as a movable electrode of a cantilever type. A variable capacitor can be formed by disposing the movable electrode facing a fixed electrode.

Figure 30:
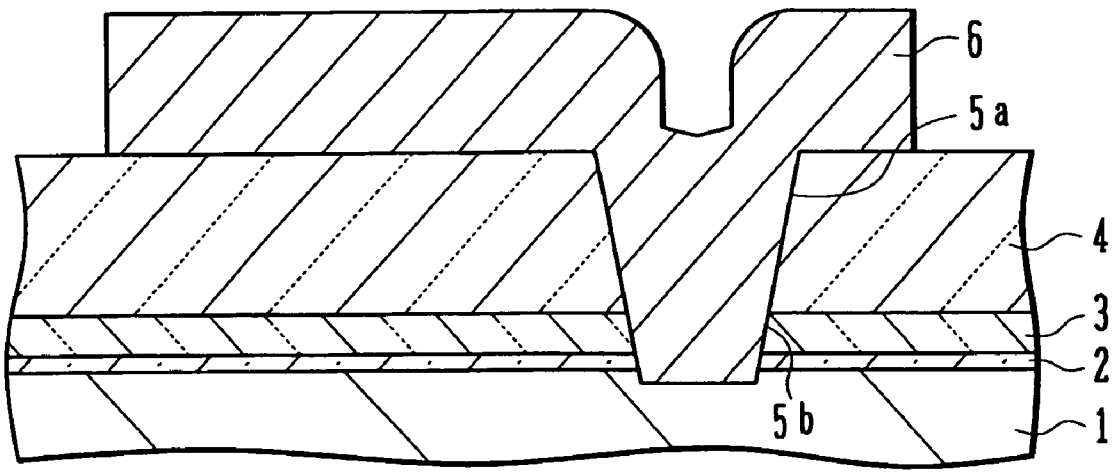
FIG. 30 is a cross sectional view illustrating the state of a micro structure of the present invention formed during studies by the present inventor, before an insulating film is removed.
Figure 31:
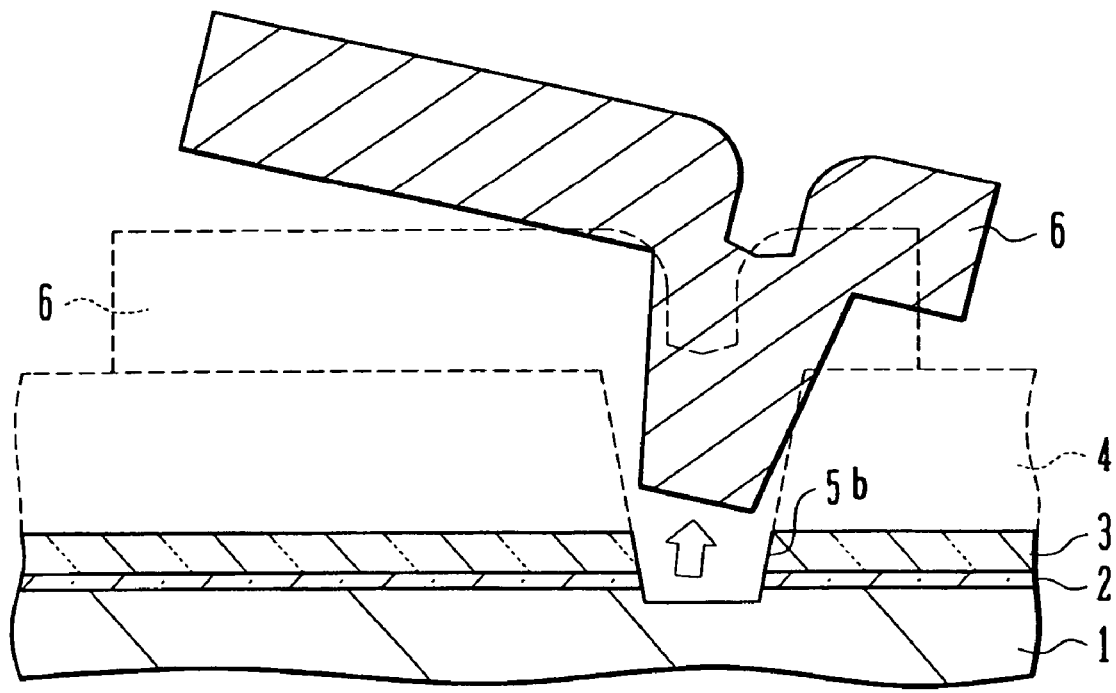
FIG. 31 is a cross sectional view illustrating the state of the micro structure shown in FIG. 16, after the insulating film is removed.
Figure 32:
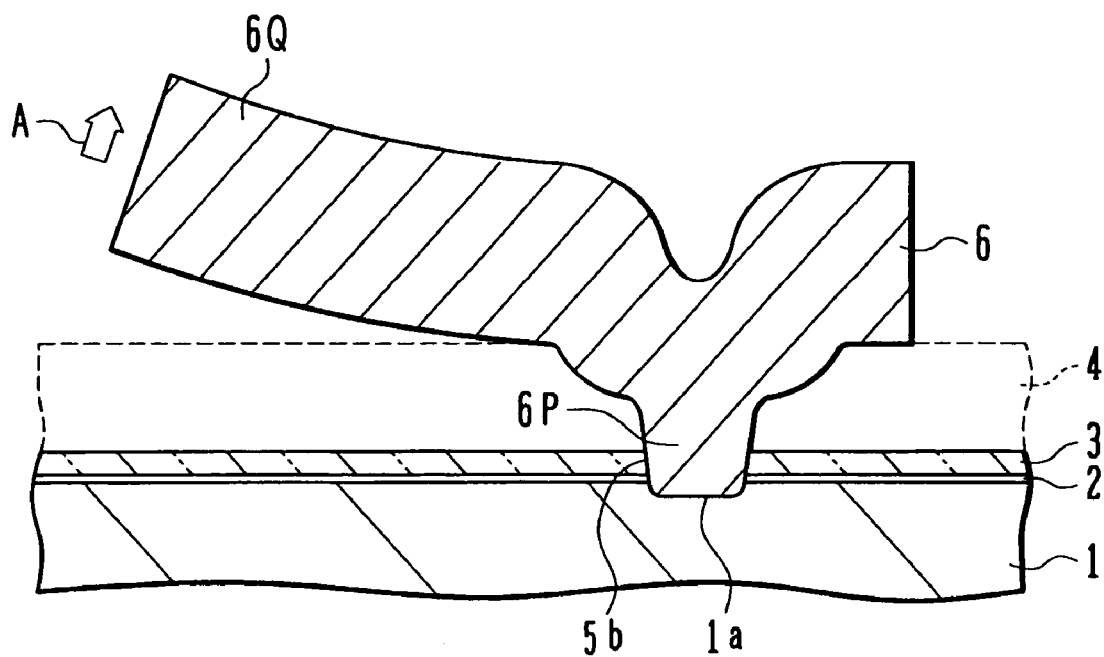
FIGS. 32 to 34 are cross sectional views showing deformation of a polysilicon layer of a micro structure formed during studies by the present inventor.
Figure 33:
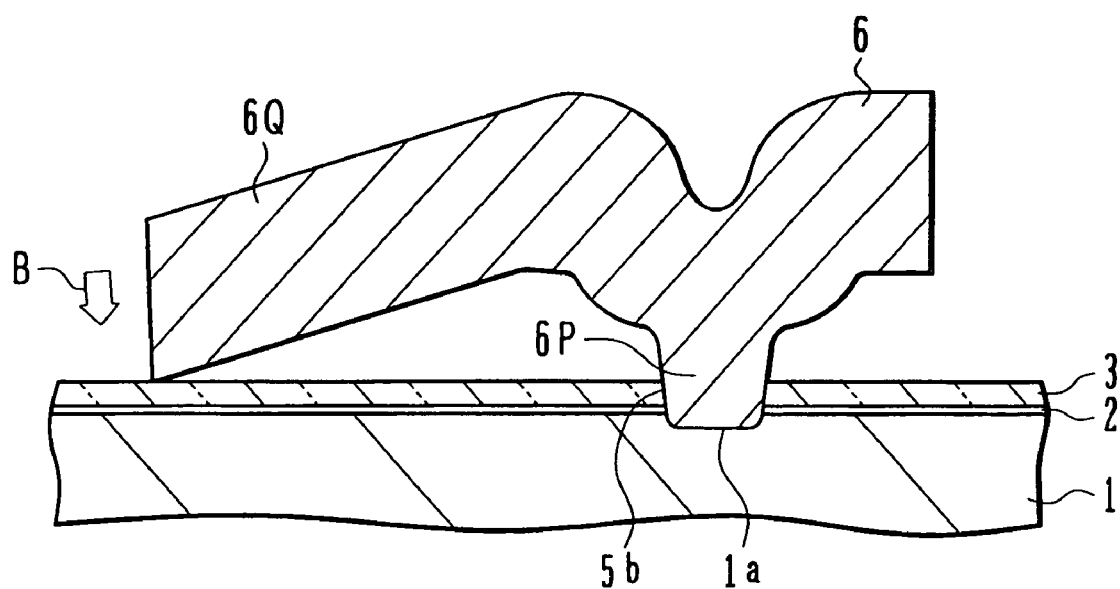
Figure 34:
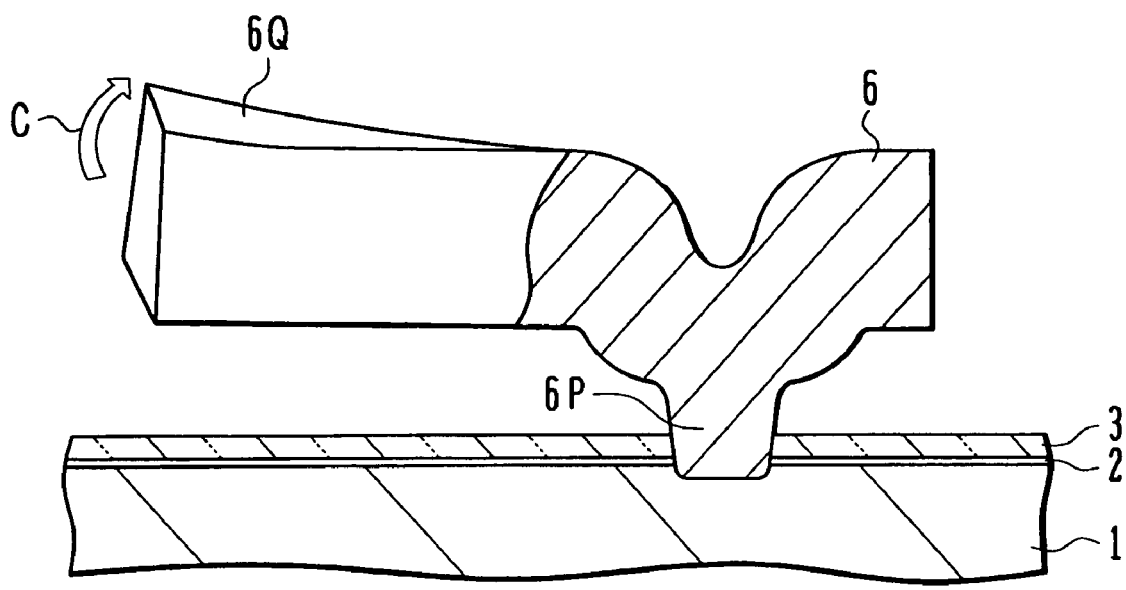

In the micro structures shown in FIGS. 5 and 6, the connection portion 20P of the conductive member 20 constitutes an insulating stack layer having the inner wall of concave and convex shapes and the interlock structure IL. Therefore, the connection portion 20P is tightly interlocked with the insulating stack layer and the conductive member 20 can be prevented from falling out of and peeling off the via holes. Furthermore, since the thickness of the insulating film 12 is made as thicker as 100 to 300 nm and the thickness of the insulating film 14 is made as thicker as 100 to 200 nm, than those of the micro structure shown in FIG. 30, the contact area between the connection portion 20P and the insulating stack layer is increased and the adhesion force of the connection portion 20P relative to the insulating stack layer is improved. It is possible to prevent more reliably the conductive member 20 from falling out of and peeling off the via holes.

Figure 7:
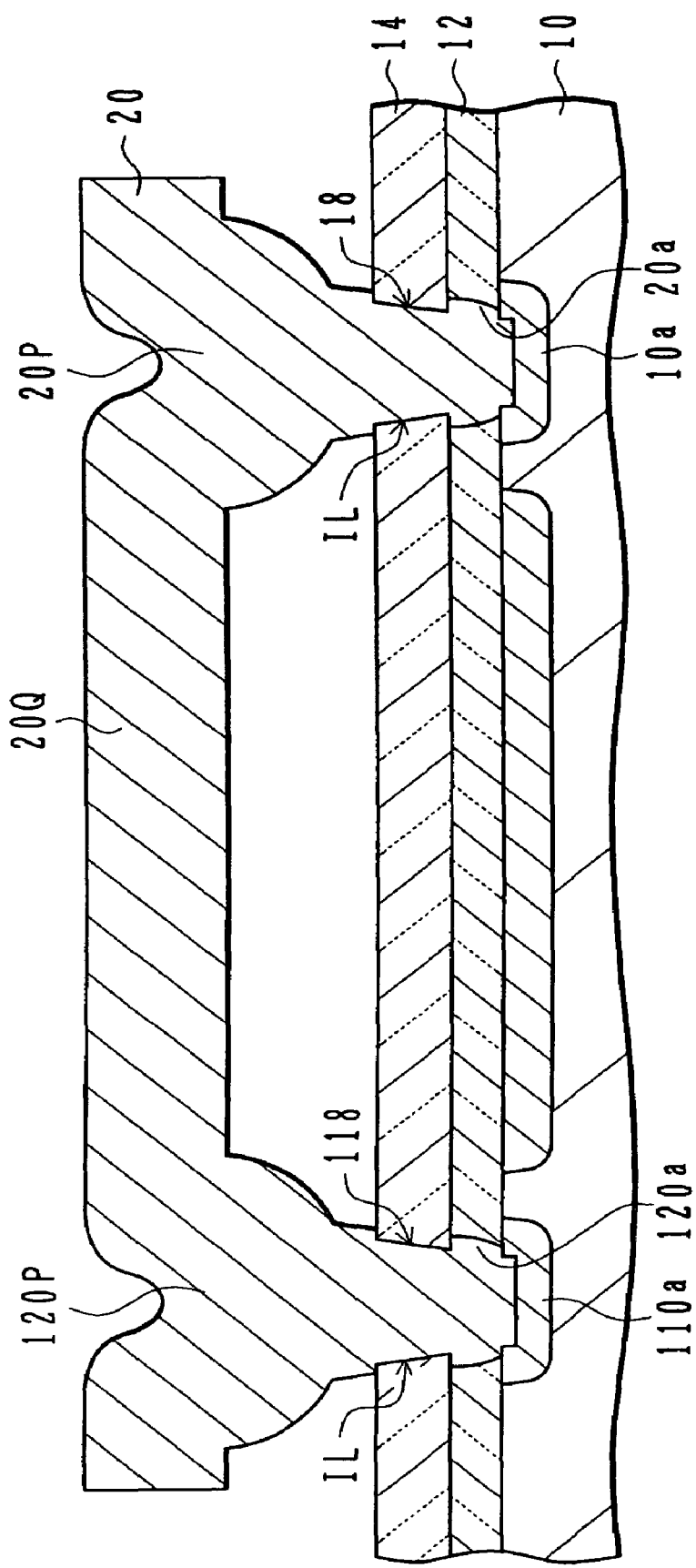
FIG. 7 is a cross sectional view showing an application example of a micro structure.
Figure 8:
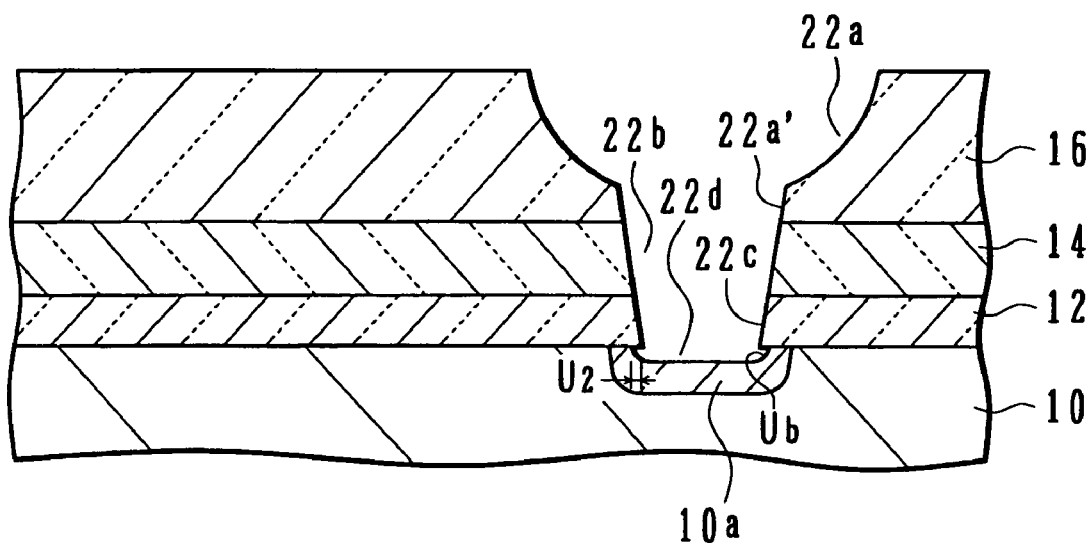
FIGS. 8 to 11 are cross sectional views illustrating main processes of a micro structure manufacture method according to another embodiment of the present invention.

FIG. 7 shows an application example of the micro structure shown in FIG. 6. In FIG. 7, like elements to those shown in FIG. 6 are represented by identical reference numerals and the description thereof is omitted.

As shown in FIG. 7, in the surface layer of a p-type substrate 10, n-type connection regions 10a and 110a and an n-type region (opposing electrode region) 11 therebetween are formed. Via holes 18 and 118 are formed through the insulating stack layer, exposing the connection regions 10a and 110a. A conductive member 20 has connection portions 20P and 120P of the same structure at opposite ends of an extension portion 20Q. The connection portion 120P is connected to the connection region 110a of the substrate 10. The via hole 118 has the same structure as that of the via hole 18 and constitutes an interlock structure IL along with the connection portion 120P to prevent the connection portion 120P from falling out of the via hole 118. More specifically; the connection portions 20P and 120P along with the via holes 18 and 118 constitute mechanically strong interlock structures IL and are electrically and mechanically connected to the connection regions 10a sand 110a. The extension portion 20Q is in the state that it is spaced from the surface of the insulating film and floats in air, constitutes a movable electrode of a both-end fixed beam type and provides a variable capacitor. A variable capacitor may be formed by disposing the conductive member shown in FIG. 5 and the floating conductive member shown in FIG. 6 facing each other.

FIGS. 8 to 11 are cross sectional views illustrating main processes of a micro structure manufacture method according to another embodiment of the present invention. In FIGS. 8 to 11, like elements to those shown in FIGS. 1 to 6 are represented by identical reference and the description thereof is omitted. In the process shown in FIG. 8, similar to the description previously made with reference to FIG. 1, on one principal surface of a semiconductor substrate 10, insulating films 12, 14 and 16 are formed and thereafter a via hole 22a is formed in the insulating film 16 by a photolithography and isotropic etching process similar to the description previously made with reference to FIG. 2.

Figure 2:
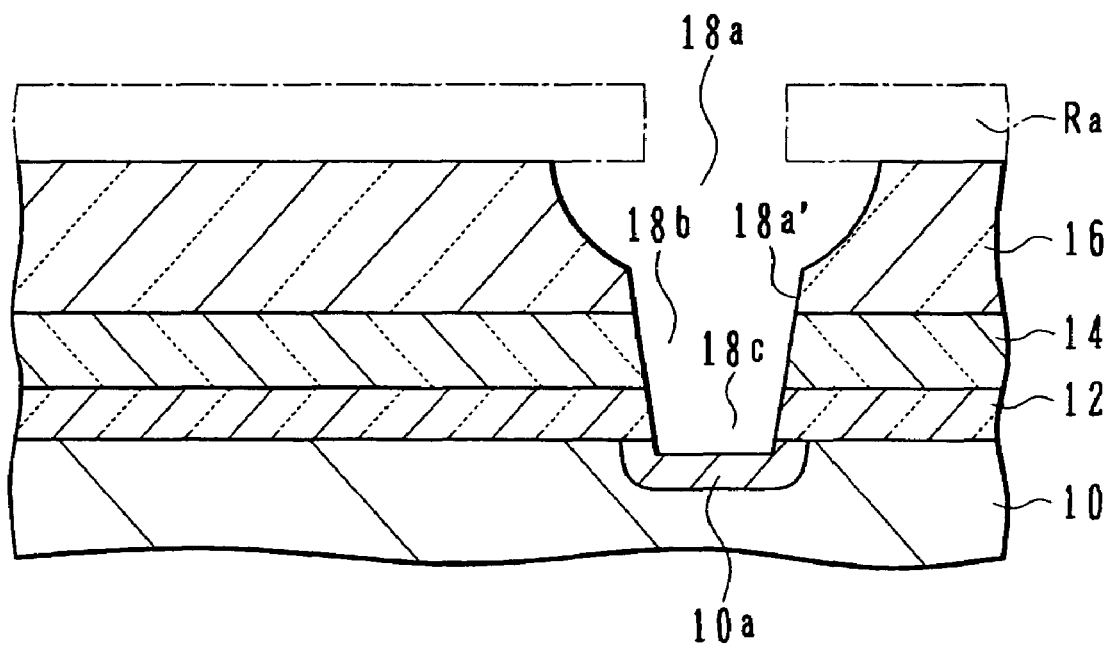

Next, similar to the description previously made with reference to FIG. 2, by using a resist layer (same as that used by isotropic etching) as a mask, via holes 22a', 22b and 22c continuous with the lower end of the via hole 22a are formed through the remaining thickness of the insulating film 16 and the whole thickness of the insulating films 14 and 12 by anisotropic dry etching. The resist layer used by anisotropic etching is thereafter removed.

Next, a connection region 10a of the silicon substrate 10 is isotropically etched to form a recess 22d crawling under the insulting film 12. The recess 22d forms an undercut $U_b$ under the insulating film 12, and the size of the upper end of the recess 22d is smaller than the size of the lower end of the via hole 22c. A side etch amount $U_2$ is set to 5 to 100 nm.

The isotropic dry etching process may be performed by using a parallel plate type plasma etching system. The etching conditions are, for example:

Gas used: mixture gas of $CF_4$ and $O_2$ (8%)
Gas flow rate: 20 to 50 sccm
Pressure: 0.1 to 0.5 Torr
RF power: 100 to 200 W
Stage temperature: 50 to 70° C.

Under these etching conditions, an undercut amount $U_2$ of 50 nm is obtained at an etching time of 30 seconds.

Under the above-described etching conditions, the insulating films 12 and 16 made of silicon oxide and the insulating film 14 made of silicon nitride are hardly etched so that the sizes and side wall shapes of the via holes 22b and 22c are hardly changed and a desired undercut $U_b$ can be obtained.

Dry etching by a chemical dry etcher may be used as the isotropic dry etching process.

Figure 9:
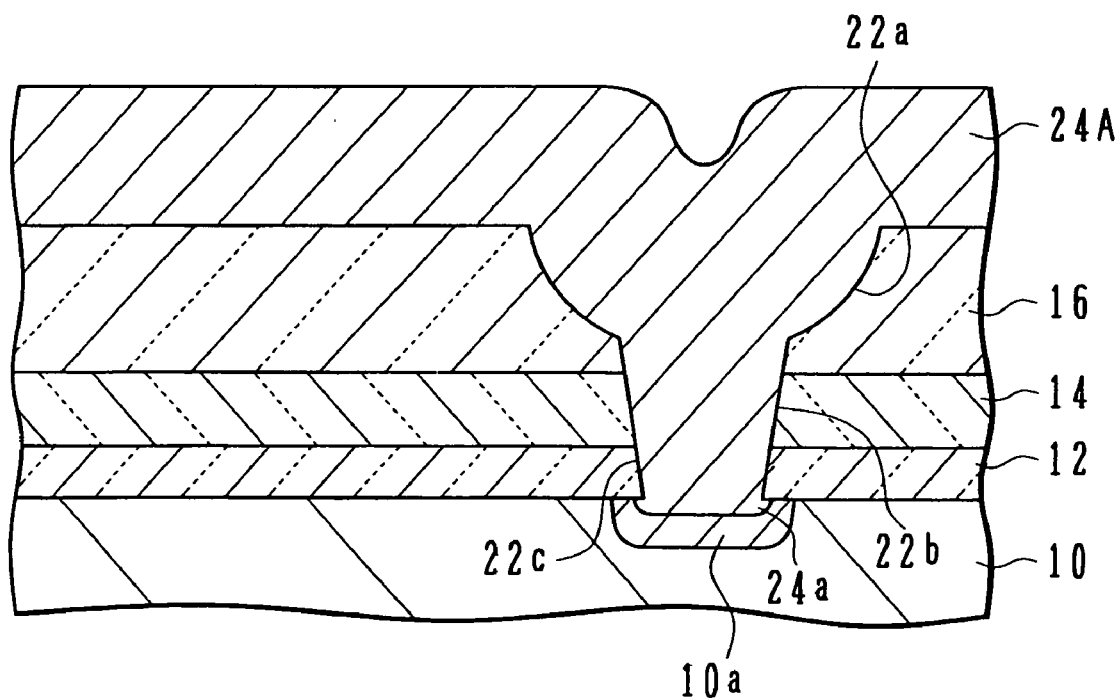

In the process shown in FIG. 9, similar to the description previously made with reference to FIG. 4A, a conductive polysilicon (doped polysilicon) layer 24A having a thickness of 1 to 10 μm (preferably 2 to 5 μm) is formed by CVD on the insulating film 16, burying the via holes 22a to 22c and recess 22d. The polysilicon layer 24A is formed burying the recess 22d, and forms an interlock portion 24A crawling under the undercut $U_b$ of the recess 22d. Similar to the description previously made with reference to FIG. 4A, as a natural oxide film is suppressed from being grown on the surface of the connection region 10a while the polysilicon layer 24A is deposited, the polysilicon layer 24A can be connected to the connection region 10a in a good adhesion state.

Figure 10:
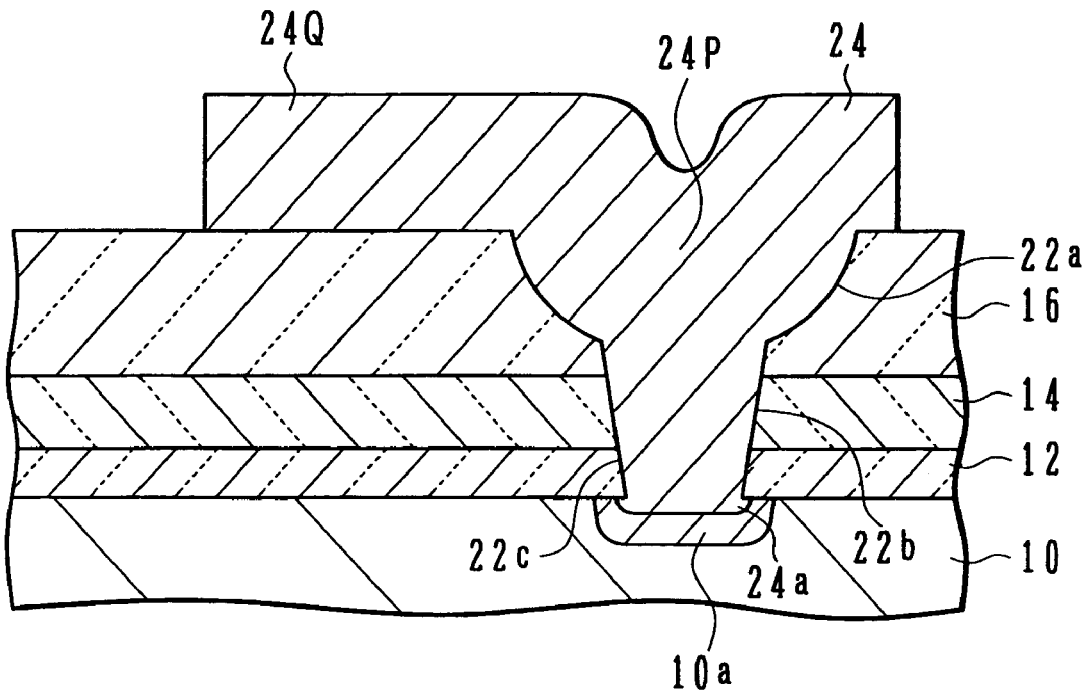

In the process shown in FIG. 10, similar to the description previously made with reference to FIG. 5, the polysilicon layer 24A is patterned to form a conductive member 24. The conductive member 24 has a connection portion 24P connected to the connection region 10a of the substrate 10 via the via holes 22a to 22c and recess 22d and an extension portion 24Q being continuous with the upper region of the connection portion and extending on the insulating film 16.

In the process shown in FIG. 11, similar to the description previously described with reference to FIG. 6, the insulating film 16 is removed. The conductive member 24 enters therefore the state that it is lifted by the connection portion 24P connected to the connection region 10a of the substrate 10 and has the extension portion 20Q spaced from and extending above the surface of the insulating film 14 in a floating state.

The conductive member 24 of the micro structure shown in FIG. 10 may be used as a fixed electrode or wiring line. The conductive member 24 of the micro structure shown in FIG. 11 may be used as a movable electrode of a cantilever type.

Figure 11:
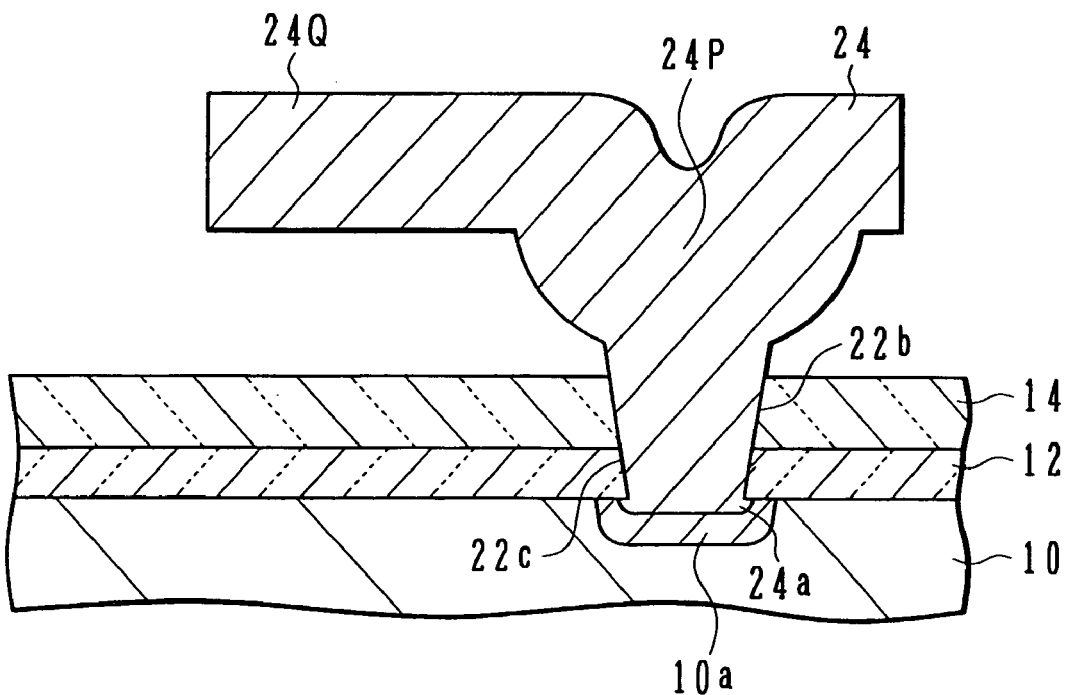

In the micro structure shown in FIG. 10 or 11, since the connection portion 24P of the conductive member 24 has the interlock portion 24a crawling under the undercut $U_b$ of the via hole 22c, the connection portion 24P is interlocked with the insulating film 12 by the interlock portion 24a so that it is possible to prevent the conductive member 24 from falling out of and peeling off the via holes 22a to 22c and recess 22d. Furthermore, since the thickness of the insulating film 12 is made as thicker as 150 to 300 nm and the thickness of the insulating film 14 is made as thicker as 100 to 200 nm, than those of the micro structure shown in FIG. 30, the contact area between the connection portion 24P and the insulating layers 12 and 14 is increased and the adhesion force of the connection portion 24P relative to the insulating layers 12 and 14 is improved. It is possible to prevent more reliably the conductive member 24 from falling out of and peeling off the via holes. Both the interlock portion shown in FIG. 10 and the interlock structure shown in FIG. 5 may be formed.

In the micro structure shown in FIG. 5 or 10, the stack layer including the insulating films 14 and 16 is disposed between the insulating film 12 and the extension portion 20Q or 24Q. If the micro structure shown in FIG. 5 or 10 is used as the finished structure, the insulating film 16 is not required to be removed so that the insulating films 16 and 14 may be made of the same insulating material (the insulating films 14 and 16 are changed to a single layer film). If the micro structure shown in FIG. 10 is used as the finished structure, the insulating films 12, 14 and 16 may be changed to a single layer film.

Figure 12:
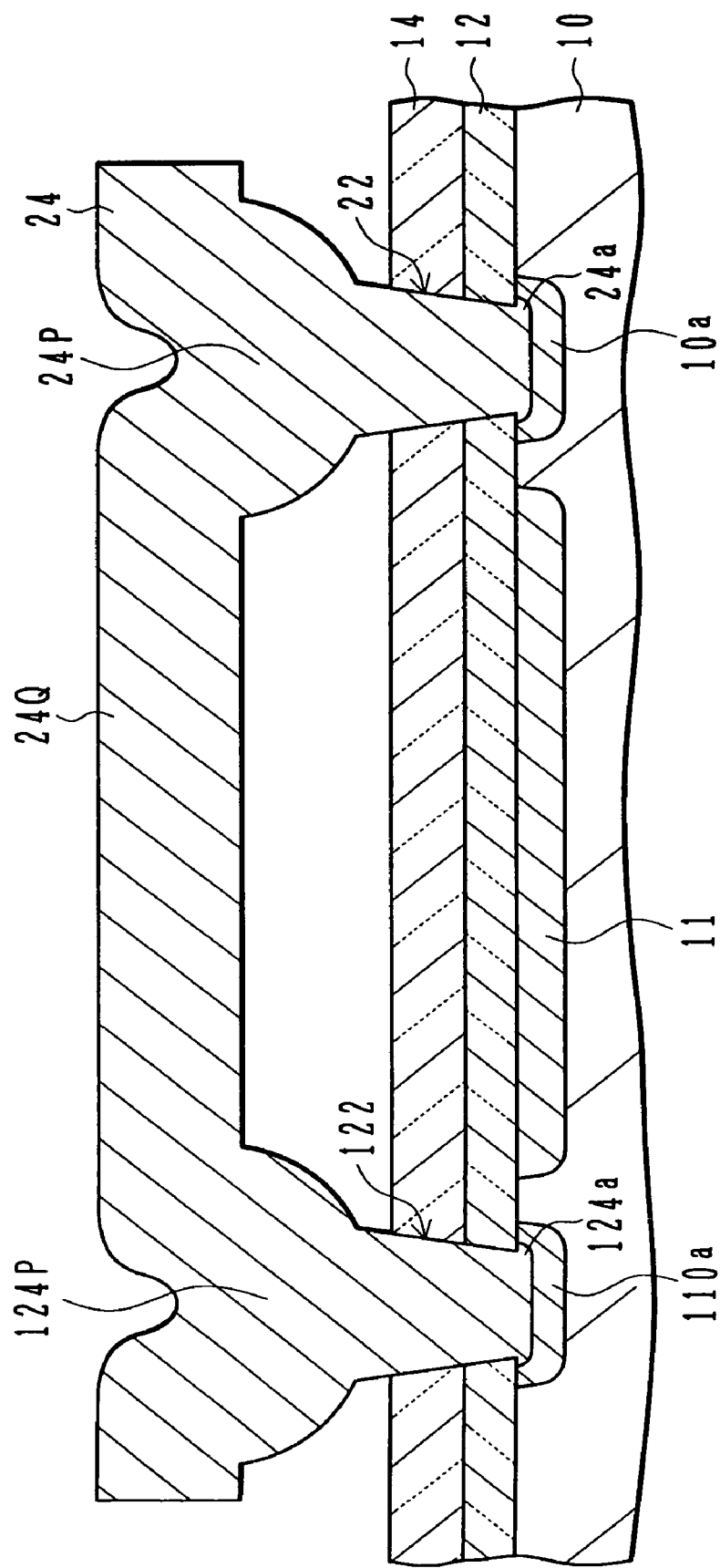
FIG. 12 is a cross sectional view showing an application example of a micro structure.

FIG. 12 shows an application example of the micro structure shown in FIG. 11. In FIG. 12, like elements to those shown in FIG. 11 are represented by identical reference numerals and the description thereof is omitted. Similar to the micro structure shown in FIG. 7, n-type regions 10a, 110a and 11 are formed in the surface layer of a substrate, and an extension 5 portion 24Q of a conductive member 24 has connection portions 24P and 124P at its opposite ends. A different point from the structure shown in FIG. 7 is the interlock states between the connection regions 24P and 124P and via holes 22 and 122. Both the interlock states are similar to that shown in FIG. 11. Interlock portions 24a and 124a corresponding to the undercut of the recess have a function to prevent the connection portions 24P and 124P from falling out of recesses.

The conductive member 24 is used as a movable electrode of a both-end fixed beam type and provides a variable capacitor.

Figure 13:
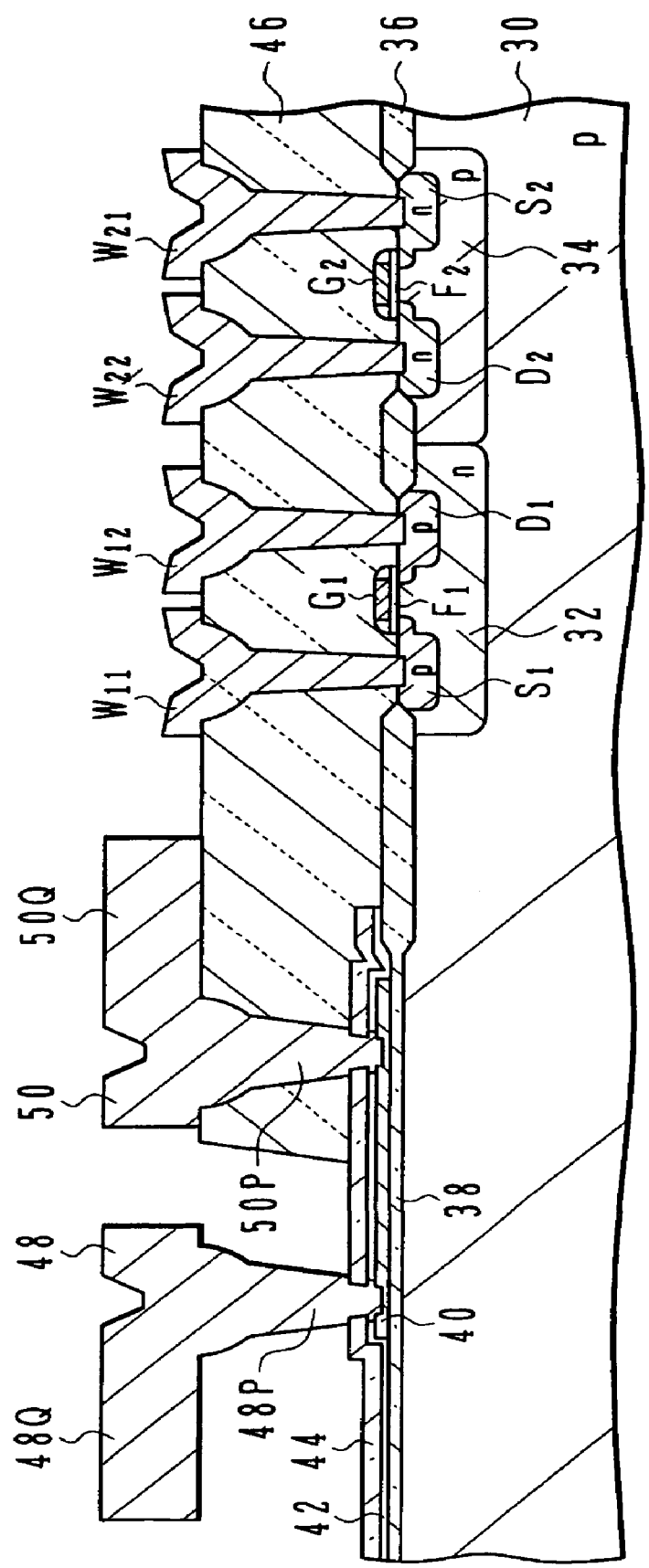
FIG. 13 is a cross sectional view showing an example of an IC device having micro structures of the present invention.

FIG. 13 shows an example of an integrated circuit (IC) device having micro structures.

In one principal surface layer of a semiconductor substrate 30 of, for example, single crystal silicon, an n-type well 32 and a p-type well 34 are formed side by side and an element isolation field insulating film 36 is formed. The field insulating film 36 is made of, for example, silicon oxide, formed by local oxidation of silicon (LOCOS) or the like and has openings corresponding to the wells 32 and 34. A p-channel MOS transistor having lightly doped drain (LDD) is formed in the n-type well 32. This transistor has a gate insulating film $F_1$, a gate electrode layer $G_1$, a p-type source region $S_1$ and a p-type drain region $D_1$. An n-channel MOS transistor having LDD is formed in the p-type well 34. This transistor has a gate insulating film $F_2$, a gate electrode layer $G_2$, an n-type source region $S_2$ and an n-type drain region $D_2$.

On the surface of the substrate electrically isolated from the wells 32 and 34 by the field insulating film 36, an insulating film 38 is formed and a wiring conductive layer 40 is formed on the insulating film. For example, the insulating film 38 is made of silicon oxide and formed by thermal oxidation used for forming the gate insulating films $F_{1\ and\ F2}$. The insulating film 38 may be formed by CVD. For example, the conductive layer 40 is made of conductive polysilicon (doped polysilicon) and formed at the same time when the gate electrodes $G_1$ and $G_2$ are formed.

On the insulating film 38, a stack of insulating films 42 and 44 is formed covering the conductive layer 40. For example, the insulating film 42 is made of CVD silicon oxide and corresponds to the insulating film (pad film) 12 shown in FIG. 1. For example, the insulating film 44 is made of silicon nitride and corresponds to the insulating film (etching stopper film) 14 shown in FIG. 1.

On the field insulating film 36, an insulating film 46 is formed covering the MOS transistors formed in the wells 32 and 34 and the insulating film 44. For example, the insulating film 46 is made of silicon oxide, corresponds to the insulating film (sacrificial film) 16 shown in FIG. 1, and is used also as an interlevel insulating film.

The insulating films 44 and 46 are formed in a manner similar to forming the insulating films 14 and 16 previously described with reference to FIG. 1. After the insulating film 46 is formed, a stack of the insulating films 42, 44 and 46 is sequentially subjected to isotropic etching and anisotropic etching similar to the description previously made with reference to FIG. 2 to thereby form via holes corresponding to a connection portion 48P of a conductive member 48 and a connection portion 50P of a conductive member 50.

Figure 3:
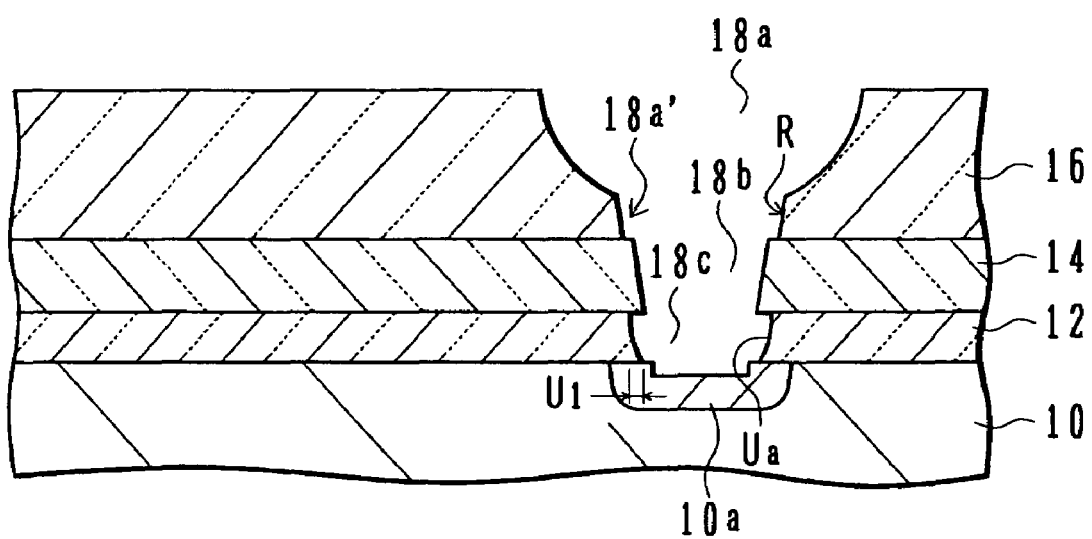

Thereafter, the via holes corresponding to the connection portions 48P and 50P are subjected to isotropic wet etching similar to the description previously made with reference to FIG. 3 to thereby form undercuts and retardation.

Next, similar to the description previously made with reference to FIGS. 4A and 5, conductive material such as doped polysilicon is deposited on the upper surface of the substrate 30 by CVD or the like and thereafter the deposited film is patterned to form the conductive members 48 and 50. The interlock structure IL is therefore formed in the region where the undercut and retardation are formed. Thereafter, by using a resist mask, contact holes are formed through the insulating film 46 by isotropic etching and anisotropic etching, corresponding to source wiring layers $W_{11}$ and $W_{12}$, and drain wiring layers $W_{12}$ and $W_{22}$.

Next, wiring material such as aluminum and aluminum alloy is deposited on the upper surface of the substrate 30 by sputtering or the like and patterned to form the wiring layers $W_{11}$, $W_{12}$, $W_{21}$ and $W_{22}$. By using a resist mask, the insulating film 46 under and near the conductive member 48 is removed by selective etching.

The connection portions 48P and 50P are therefore formed which are connected to connection regions of the conductive layer 40 and have the interlock structures IL. The extension portion 48Q is therefore obtained which is continuous with the upper region of the first connection region of the conductive layer 40, and is spaced from and extends above the insulating film 44 in a floating state. The extension portion 50Q is also obtained which is continuous with the upper region of the connection portion 50P connected to the second connection region of the conductive layer 40, and extends on the insulating film 46. The conductive member 48 can be used as a movable electrode of a cantilever type, and the conductive member 50 can be used as a fixed electrode or wiring line.

Since the IC device shown in FIG. 13 has the interlock structure at the connection portions 48P and 50P of the conductive members 48 and 50, the mechanical connection between the conductive members 48 and 50 and the conductive layer 40 is reliable and the conductive members can be prevented from falling out of the via holes. Silicon oxidation, polysilicon deposition, patterning, silicon oxide deposition and the like can be performed commonly for both the micro structure area and transistor area (if necessary, contact hole formation can be performed commonly for both the micro structure area and transistor area), simplifying the manufacture processes.

The IC device of FIG. 13 contains variable capacitors formed of floating electrodes, and CMOS circuits formed of n-channel MOS transistors and p-channel MOS transistors, including capacitance detection circuit, amplifier circuit, analog-to-digital (A/D) conversion circuit, signal processing circuit, input/output circuit, control circuit, power source circuit, etc.

Figure 14:
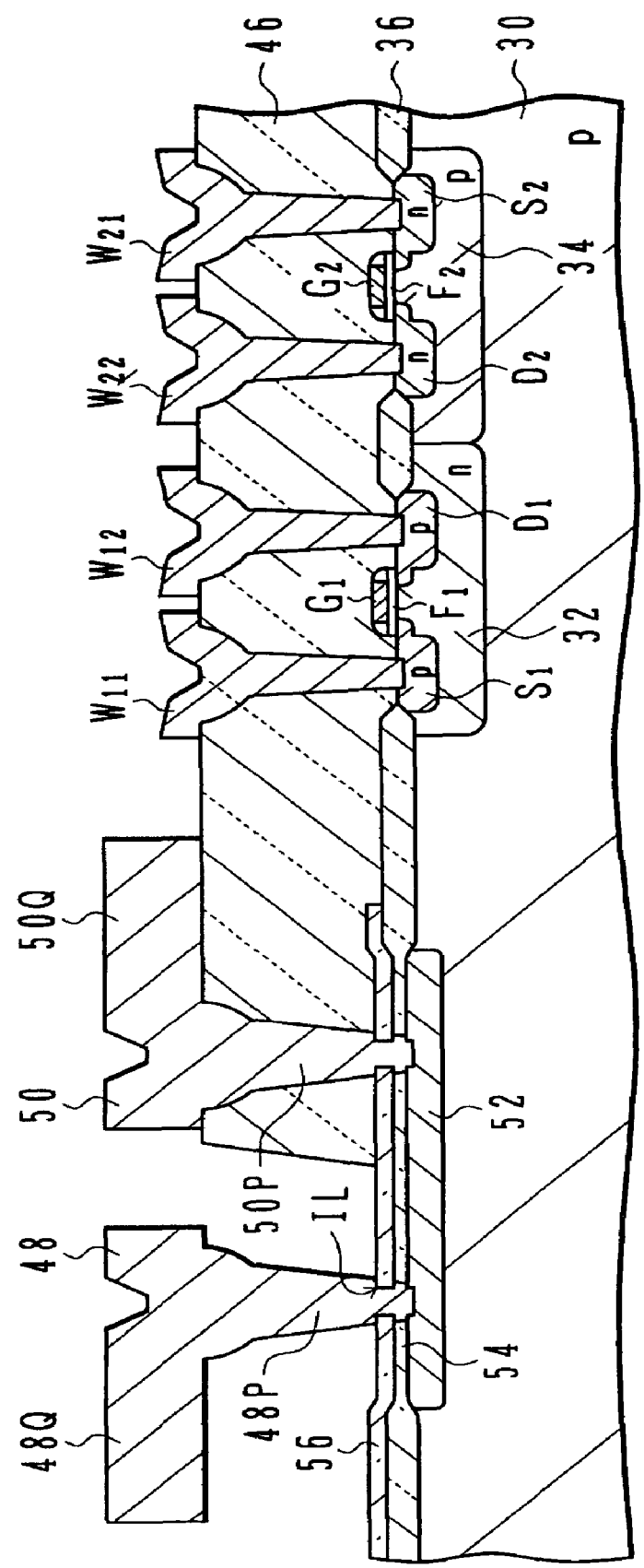
FIG. 14 is a cross sectional view showing another example of an IC device having a micro structure of the present invention.

FIG. 14 shows another example of an IC device having micro structures. In FIG. 14, like elements to those shown in FIG. 13 are represented by identical reference numerals and the detailed description thereof is omitted.

The IC device shown in FIG. 14 is characterized by an impurity doped region 52 formed in a silicon substrate as a wiring conductive layer. Namely, an n-type impurity doped region 52 is formed in the substrate in an opening area of a field insulating film 36. This impurity doped region 52 can be formed by impurity doping used for forming an n-type source region $S_2$ and an n-type drain region $D_2$ The surface of the impurity doped region 52 is covered with an insulating film 54. For example, the insulating film 54 is made of silicon oxide and corresponds to the insulating film (pad film) 12 shown in FIG. 12. The silicon oxide film is formed by thermal oxidation used for forming gate insulating films $F_{1\ and\ F2}$. The silicon oxide film may be formed by CVD.

An insulating film 56 is formed covering the insulating film 54. For example, the insulating film 56 is made of silicon nitride and corresponds to the insulating film (etching stopper film) 14 shown in FIG. 1. The insulating film 56 is formed in the manner similar to forming the insulating film 14 shown in FIG. 1.

After an insulating film 46 is formed covering the insulating film 56, via holes corresponding to connection portions 48P and 50P are formed through a stack of the insulating films 54, 56 and 46, similar to the description previously made with reference to FIG. 13. These via holes have undercuts and retardation. Thereafter, similar to the description previously made with reference to FIG. 13, conductive members 48 and 50 are formed each having the interlock structure IL. Similar to the description previously described with reference to FIG. 13, the interlock structures IL function to prevent the conductive members 48 and 50 from falling out of the via holes.

Figure 15:
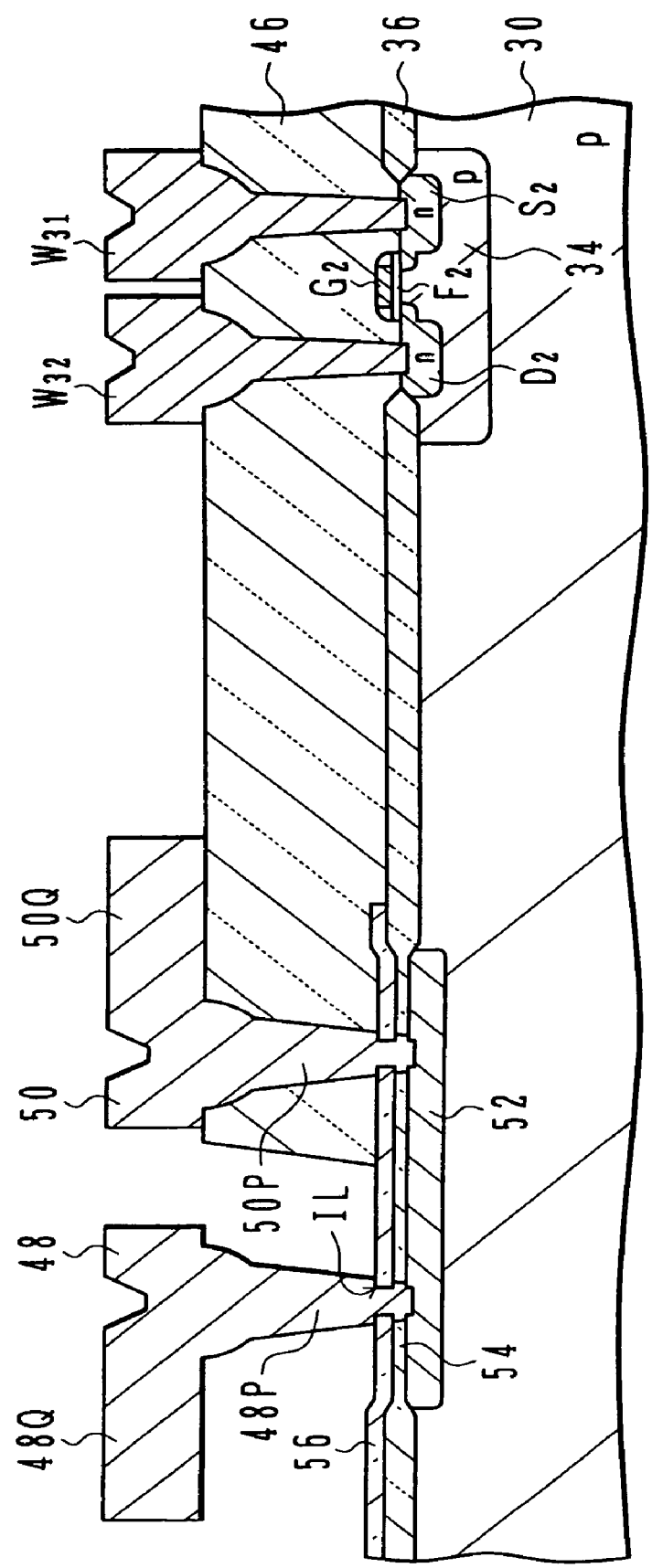
FIG. 15 is a cross sectional view showing still another example of an IC device having a micro structure of the present invention.

FIG. 15 shows another example of an IC device having micro structures. In FIG. 15, like elements to those shown in FIGS. 13 and 14 are represented by using identical reference numerals and the detailed description thereof is omitted.

The IC device shown in FIG. 15 corresponds to the IC device shown in FIG. 14 excepting that the n-type well 32 and its transistor are omitted and a source wiring layer $W_{31}$ and a drain wiring layer $W_{32}$ of a transistor formed in the p-type well 34 are made of the same material as that of the conductive members 48 and 50. At the same time when the conductive members 48 and 50 are formed by using doped polysilicon, the wiring layers $W_{31}$ and $W_{32}$ are also formed by using the doped polysilicon. In this case, openings for contact holes can be formed at the same time for both the micro structure area and transistor.

In the IC devices shown in FIGS. 13 to 15, although the interlock structure shown in FIG. 5 or 6 is used as the interlock structure of the conductive member 48 or 50, the interlock portion shown in FIG. 10 or 11 may be adopted. In the IC device shown in FIG. 13, similar to the description previously made with reference to FIG. 7 or 12, the conductive member 48 may have first and second connection portions which are connected to the first and second spaced connection regions of the conductive layer 40 to have first and second interlock portions and coupled by the extension portion 48Q, to form a movable electrode. FIGS. 16 to 20 are cross sectional views illustrating main processes of a micro structure manufacture method according to another embodiment of the present invention. Processes (1) to (5) corresponding to FIGS. 16 to 20 will be described sequentially.

(1) On one principal surface of a semiconductor substrate 10 made of, for example, single crystal silicon, a first insulating film 12, a second insulating film 14 and a third insulating film 16 are stacked sequentially. The insulating film 12 is used as a pad film, and made of, for example, a silicon oxide film having a thickness of 50 to 400 nm. This silicon oxide film is formed by a thermal oxidation method although it may be formed by a CVD method or the like.

The insulting film 14 is used as an etching stopper film, and made of, for example, a silicon nitride film having a thickness of 100 to 200 nm. This silicon nitride film is formed by a CVD method or the like. The insulating film 16 is used as a sacrificial film, and made of, for example, a silicon oxide film having a thickness of 1 to 4 μm. This silicon oxide film is formed by a CVD method or the like. For example, a silicon oxide film of the insulating film 16 is formed by the CVD method using tetra ethyl ortho silicate (TEOS) and oxygen as source material, and phosphorus is doped into the silicon oxide film to form phosphorus-silicate glass (PSG) or phosphorus and boron are doped into the silicon oxide film to form boron-phosphorus-silicate glass (BPSG).

Before the insulating films 12, 14 and 16 are formed on the principal surface of the substrate 10, for example, an n-type impurity doped region 10a is formed. The impurity doped region 10a is used as a wiring region. (2) A resist pattern Ra having an opening for forming a via hole is formed on the insulating film 16 by photolithography, and thereafter a via hole 18a is formed in the insulating film 16 by isotropic etching using the resist pattern Ra as a mask.

Next, a via hole 18b is formed through a stack of the insulating films 12, 14 and 16 by anisotropic etching using the resist pattern Ra as a mask. The via hole 18b has a size smaller than that of the via hole 18a, is formed continuous with the bottom of the via hole 18a and exposes the impurity doped region 10a. The interlock structure of the above-described embodiment may be formed on the via hole 18b. The resist pattern Ra is thereafter removed. (3) Polysilicon is deposited on the insulating film 16, burying the via holes 18a and 18b, to form a conductive polysilicon (doped polysilicon) layer 20A having a thickness of 1 to 15 μm (preferably 2 to 5 μm). The polysilicon layer 20A is connected to the doped region 10a via the via holes 18a and 18b. When the polysilicon layer 20A is formed, impurities such and phosphorus and boron are doped in situ in a mol ratio impurities/polysilicon range of 0.05 to 0.20. For example, the polysilicon layer 20A is formed by using a low pressure CVD system under the conditions of:

Pressure: 60 to 70 Pa
Film forming temperature: 550 to 620° C.
$SiH_4$ gas flow rate: 1000 sccm
$PH_3$ gas flow rate: 50 to 200 sccm The flow rate ratio of $PH_3$ gas/$SiH_4$ gas corresponds to the above-described mol ratio of 0.05 to 0.20. The sheet resistance of the polysilicon layer 20A is set to about 5 to 15 Ω/□ at a polysilicon layer thickness of 3 μm. If boron is to be doped, $B_2H_5$ gas may be used.

Instead of the polysilicon layer 20A, amorphous silicon may be deposited to form an amorphous silicon layer. A thickness of the amorphous silicon layer is set to 1 to 15 μm (preferably 2 to 5 μm) and the concentration range of impurities to be doped in situ is set to a mol ratio impurities/polysilicon range of 0.057 to 0.20.

The polysilicon layer 20A or amorphous silicon layer may contain germanium (Ge) or carbon (C). If Ge is contained, Ge and Si form solid solution at an arbitrary composition. If Ge is contained, the polysilicon layer 20A or amorphous silicon layer can be formed at a lowered RTA temperature. Since strain in the polysilicon or amorphous silicon layer is removed, it becomes easy to prevent a warp of the layer. Ge is contained about 1 to 30 mol % (preferably 5 to 15 mol %). If C is contained, C forms Si-C bonds in the polysilicon layer or amorphous silicon layer and the micro structure becomes hard. It becomes easy to prevent warp of the layer. It is preferable to contain C about 0.5 to 10 mol % (more preferably 1 to 5 mol %).

Next, the polysilicon layer 20A is subjected to an annealing process to relax stress. The annealing process may be performed by an RTA process using a lamp annealing system. For example, the annealing process conditions may be:

Temperature rise time: 5 to 60 sec
Arrival temperature: 800 to 1100° C. (more preferably 1000 to 1100° C.)
Arrival temperature holding time: 5 to 60 sec The RTA process has a shorter process time than a furnace annealing process so that it has the advantages that a throughput is improved and even if elements such as transistors are formed on the substrate 10, it is easy to reduce a variation in the characteristics of the elements.

(4) By using a resist pattern as a mask and a selective dry etching process, the polysilicon layer 20A is patterned to form a conductive member 20. The conductive member 20 has a connection portion 20P connected to the doped region 10a of the substrate 10 via the via holes 18a and 18b and an extension portion 20Q being continuous with the upper region of the connection portion and extending on the insulating film 16. The above-described annealing process may be performed after the patterning process.

(5) The insulating film 16 is removed by wet etching. During this process, the insulating film 14 functions as the etching stopper film. The conductive member 20 enters therefore the state that it has the connection portion 20P connected to the doped region 10a of the substrate 10 via the via hole 18b and the extension portion 20Q spaced from and extending above the surface of the insulating film 14 in a floating state.

Figure 19:
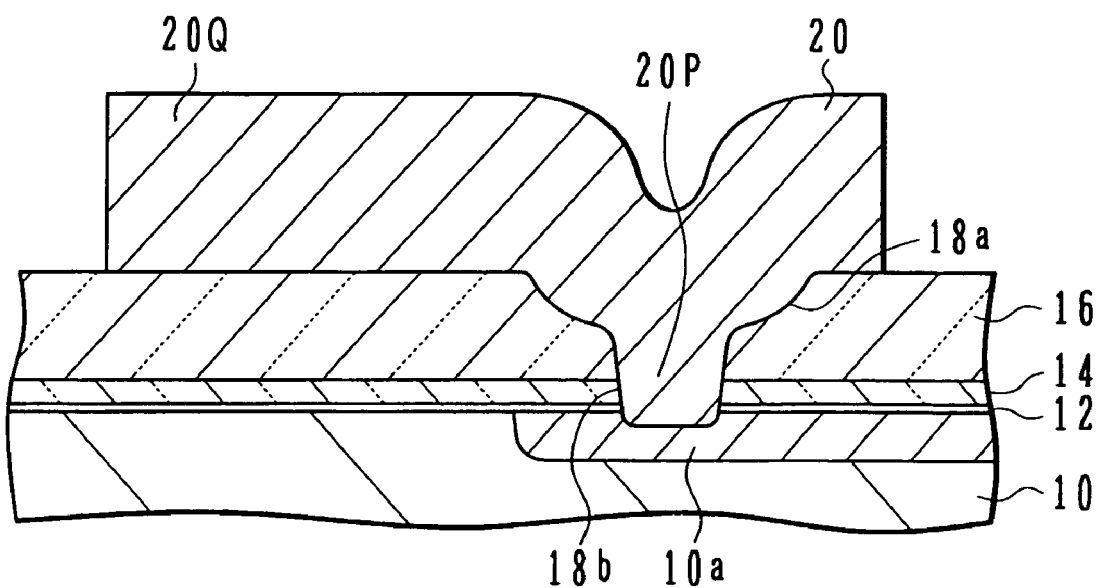
Figure 20:
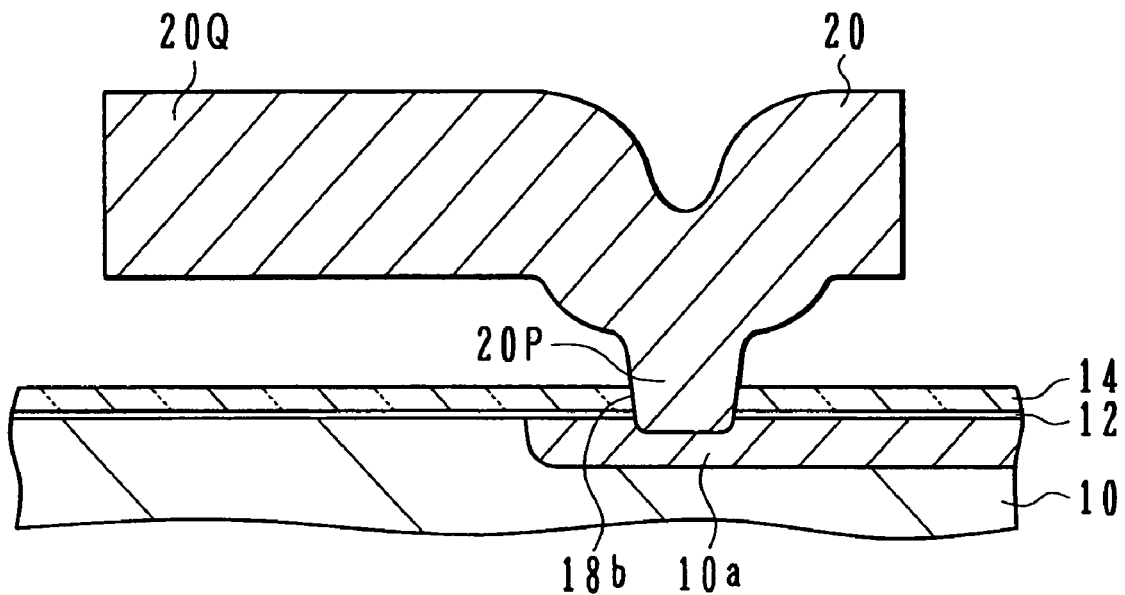

The conductive member 20 of the micro structure shown in FIG. 19 may be used as a fixed electrode or wiring line. The conductive member 20 of the micro structure shown in FIG. 20 may be used as a movable electrode of a cantilever type. A connection portion similar to the connection portion 20P may be formed at the other end to form a movable electrode of a both-end fixed beam type.

Figure 18:
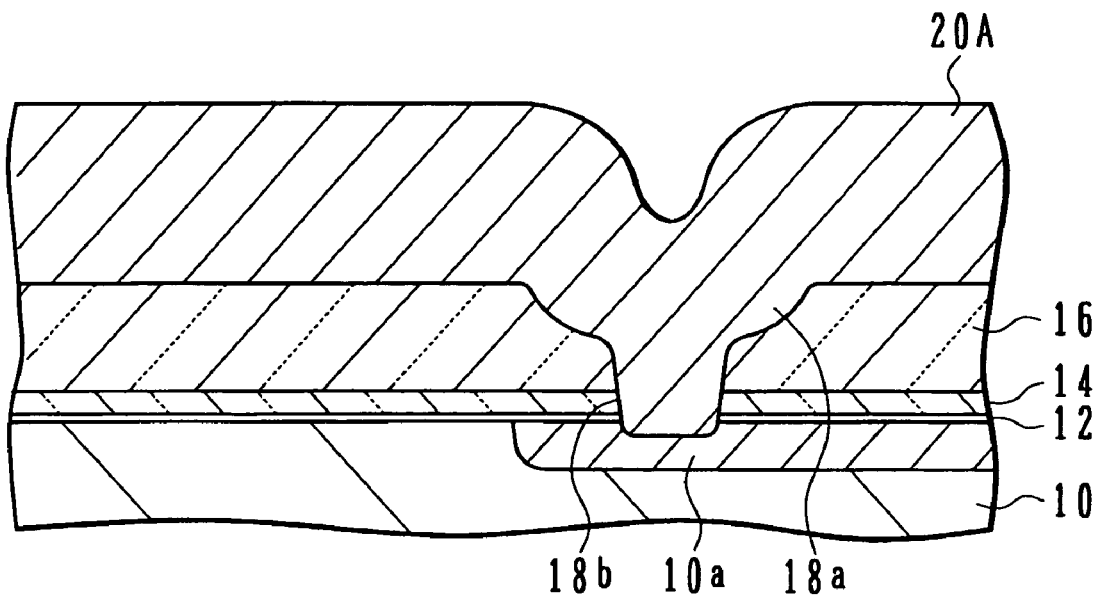

According to the micro structure manufacture method described above, the impurity concentration of the polysilicon layer 20A formed at the process shown in FIG. 18 has a high mol ratio impurities/silicon range of 0.05 to 0.20 and is uniform independently from a thickness of the polysilicon layer. The RTA process shown in FIG. 19 can relax residual stress of the polysilicon layer 20A in a short time. It can effectively prevent warp and twist of the extension portion 20Q of the conductive member 20 having a thickness of 1 to 15 μm.

Figure 21:
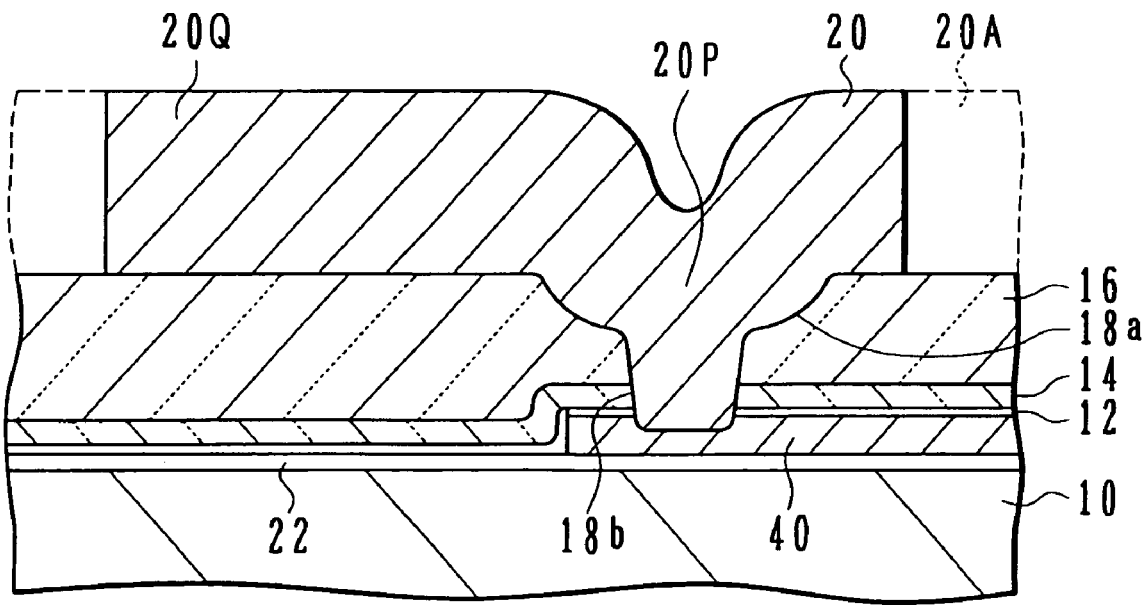
FIG. 21 is a cross sectional view illustrating a micro structure manufacture method according to another embodiment of the present invention.

FIG. 21 is a cross sectional view illustrating a micro structure manufacture method according to another embodiment of the present invention. In FIG. 21, like elements to those shown in FIGS. 16 to 20 are represented by identical reference numerals and the description thereof is omitted.

After an insulating film 22 is formed on one principal surface of a semiconductor substrate 10, a conductive layer 40 is formed on the insulating film 22. For example, the insulating film 22 is a silicon oxide film formed by thermal oxidation or CVD, and the conductive layer 40 is a conductive polysilicon (doped polysilicon) layer formed by CVD. The material of the conductive layer 40 may be refractory metal such as Ti, W and Mo or its silicide. The conductive layer 40 is used as a wiring layer.

Figure 16:
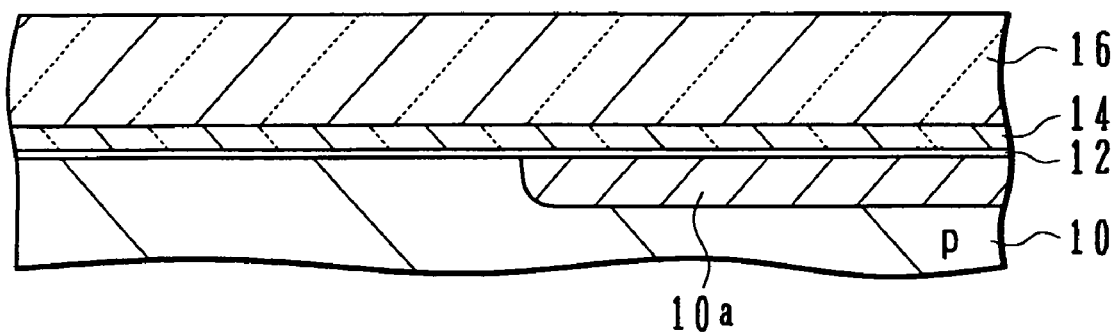
FIGS. 16 to 20 are cross sectional views illustrating main processes of a micro structure manufacture method according to another embodiment of the present invention.
Figure 17:
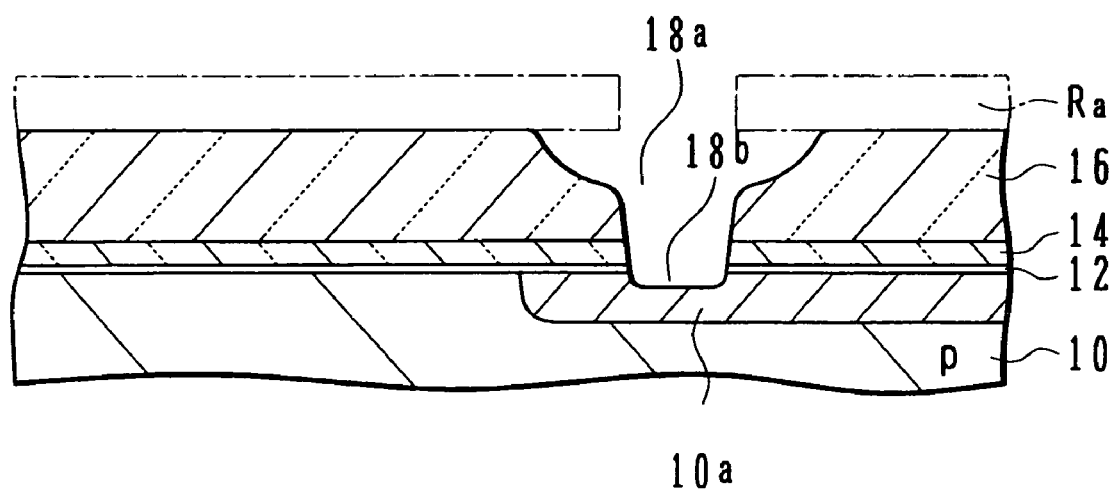

Similar to the description previously made with reference to FIG. 16, insulating films 12, 14 and 16 are formed on the insulating film 22, covering the conductive layer 40. Similar to the description previously made with reference to FIG. 17, via holes 18a and 18b are formed through a stack of the insulating films 12, 14 and 16 and thereafter, a doped polysilicon layer 20A is formed on the insulating film 16, burying the via holes 18a and 18b, similar to the description previously made with reference to FIG. 18.

Thereafter, similar to the description previously made with reference to FIG. 19, the polysilicon layer 20A is patterned to form a conductive member 20. Before or after the patterning process, an annealing process is performed for the polysilicon layer 20A or conductive member 20 similar to the description previously made with respect to FIG. 18. If necessary, the insulating film 16 is removed similar to the description previously made with reference to FIG. 20.

According to this manufacture method described with reference to FIG. 21, the operation and advantageous effects similar to the description previously made with reference to the manufacture method shown in FIGS. 16 to 20 can be obtained. It can effectively prevent warp and twist of the extension portion 20Q of the conductive member 20 among others.

FIGS. 22 to 25 are cross sectional views illustrating main processes of a micro structure manufacture method adopting a dry etching process according to another embodiment of the present invention. Processes (1) to (4) corresponding to FIGS. 22 to 25 will be described sequentially.

Figure 27:
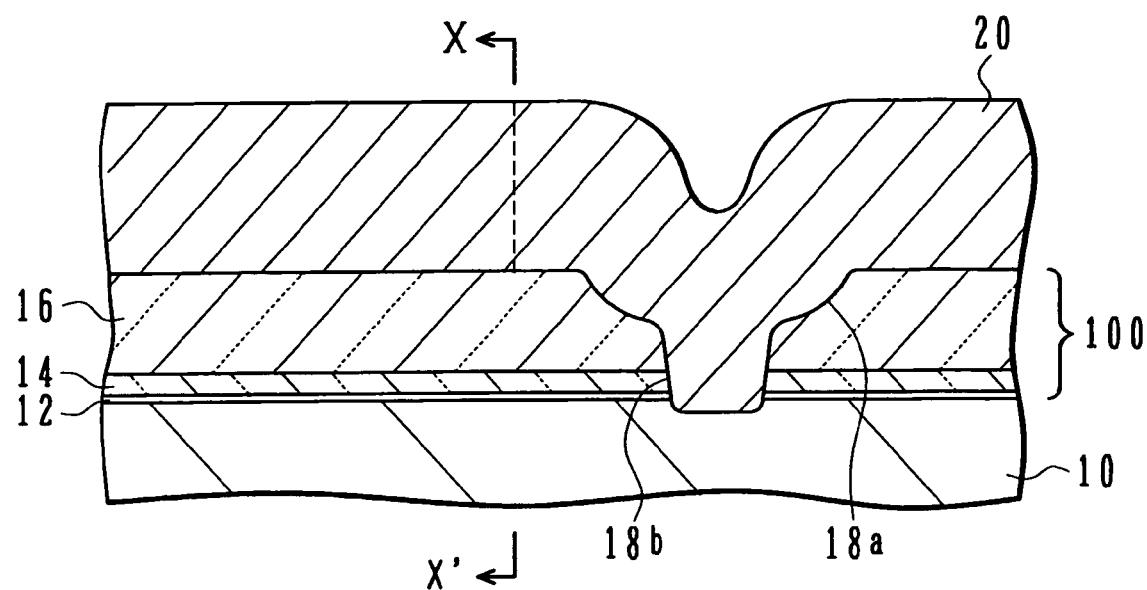
FIG. 27 is a cross sectional view perpendicular to the substrate cross sectional view shown in FIG. 22, illustrating an insulating film forming process, a via hole forming process and a polysilicon depositing process.

(1) On a principal surface of a semiconductor substrate 10 like those of the above-described embodiments, an underlying insulating film 100 is formed. FIG. 27 is a cross sectional view of the substrate perpendicular to the substrate cross sectional view shown in FIG. 22. A cross sectional view taken along line X-X' shown in FIG. 27 corresponds to the cross sectional view shown in FIG. 22. The underlying insulating film 100 may have a three-layer structure of insulating films 12, 14 and 16 shown in FIG. 27. The insulating film 12 is used as a pad film and made of, for example, a silicon oxide film having a thickness of 50 to 400 nm. This silicon oxide film is formed by thermal oxidation or CVD.

The insulating film 14 is used as an etching stopper film and made of, for example, a silicon nitride film having a thickness of 100 to 200 nm. This silicon nitride film is formed by CVD or the like. The insulating film 16 is used as a sacrificial film and made of, for example, a silicon oxide film having a thickness of 1 to 4 μm. This silicon oxide film is formed by CVD or the like. The insulating film 16 may be a PSG film, a BPSG film or the like.

Figure 22:
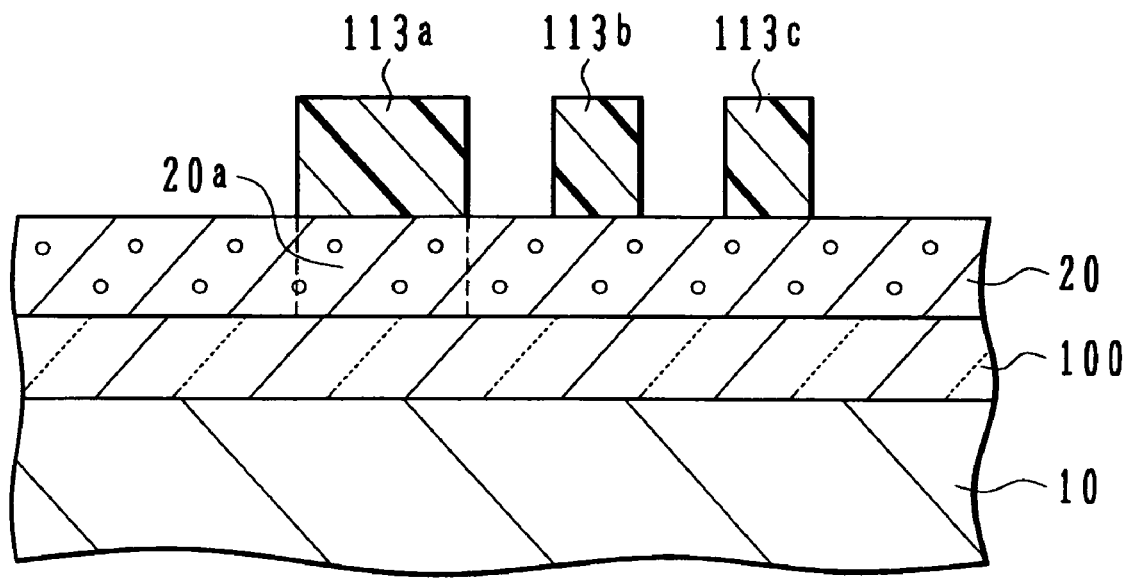
FIGS. 22 to 25 are cross sectional views illustrating main processes of a micro structure manufacture method adopting a dry etching process according to another embodiment of the present invention.

Next, as shown in FIG. 27, a via hole 18a is formed in the insulating film 16 by isotropic etching. A via hole 18b is formed through an insulating film stack by selective anisotropic etching, the via hole 18b being continuous with the via hole 18a and exposing the surface of the underlying layer. If the insulating film has a stack structure, the interlock structure may be formed on the side wall of the via hole similar to the above-described embodiments. Thereafter, as shown in FIGS. 22 and 27, a conductive polysilicon (doped polysilicon) layer 20 having a thickness of 1 to 15 μm (preferably 2 to 5 μm) is formed on the insulating film 100, burying the via holes 18a and 18b. As shown in FIG. 27, the polysilicon layer 20 reaches the surface of the silicon substrate via the via holes 18a and 18b. When the polysilicon layer 20 is formed, impurities such as phosphorus and boron are doped in situ in a mol ratio impurities/polysilicon range of 0.05 to 0.20. The impurities lower a resistivity of the polysilicon layer 20 and make it easy to relax residual stress in the polysilicon layer 20. A sheet resistance of the formed polysilicon layer 20 is about 5 to 15 Ω/□ at a polysilicon layer thickness of 3 μm.

Instead of the polysilicon layer, an amorphous silicon layer may be formed. The polysilicon layer or amorphous silicon layer may contain germanium or carbon. In this case, in order to etch the amorphous silicon layer under the conditions generally same as those for the polysilicon layer, the germanium content is set to 30 mol % or smaller and the carbon content is set to 10 mol % or smaller.

Next, the polysilicon layer 20 is subjected to an annealing process to relax stress. The annealing process may be performed by RTA using a lamp annealing system. RTA has a shorter process time than furnace annealing so that it has the advantages that a throughput is improved and even if elements such as transistors are formed on the substrate 10, it is easy to reduce a variation in the characteristics of the elements.

Next, resist patterns 113a to 113c are formed on the polysilicon layer 20 by photolithography, the resist patterns having the shapes corresponding to those of electrodes or wiring pattern. The resist patterns 113a to 113c correspond to some of a number of resist patterns formed in one sensor region 112 on the upper surface of the substrate (wafer) shown in FIG. 26. In the sensor region 112, an acceleration sensor or the like is formed. The substrate 10 has a sensor area 111 in which a number of sensor regions 112 are formed. Similar to the resist patterns 113a to 113c, resist patterns are formed in each sensor region 112.

Figure 26:
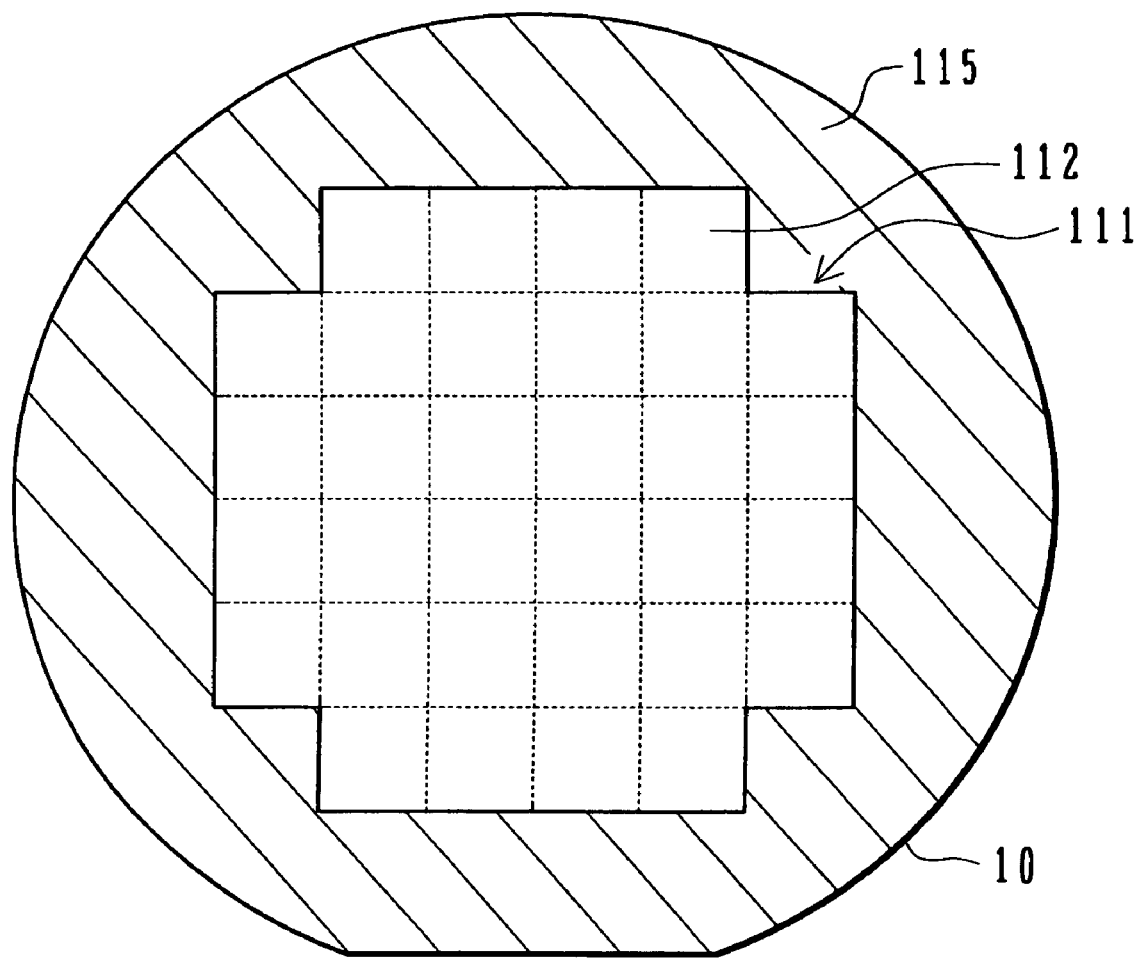
FIGS. 26 is a top view illustrating the state of forming a resist layer on the upper surface of a substrate.

If the resist patterns only in the sensor area 111 cannot have a resist occupying area of 10 to 40% (preferable 20 to 35%) on the upper surface of the substrate shown in FIG. 26, an additional resist pattern 115 is formed around the sensor area 111 to set the resist occupying area on the upper surface of the substrate to 10 to 40% (preferably 20 to 35%). The additional resist layer 115 is formed at the same time when the resist patterns 113a to 113c are formed.

Figure 23:
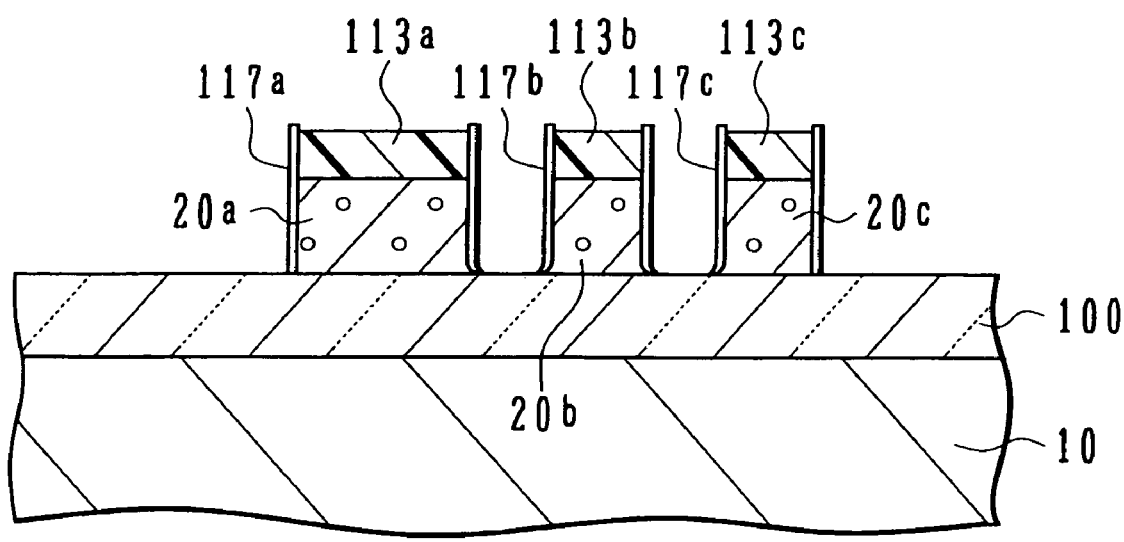

(2) Next, by using the resist patterns 115, 113a to 113c as a mask, the polysilicon layer 20 is anisotropically etched (main etching) by plasma etching. Namely, the anisotropic etching is performed until the insulating film (silicon oxide film) 16 as the underlying film is exposed, in a relatively large opening space (an area having an aspect ratio of 1.0 or smaller [an area having an opening space of 3.0 µm or larger at a thickness of 3.0 µm of the polysilicon layer 20]) to form a plurality of polysilicon layers 20a to 20c. Controllability of the size and pattern of the polysilicon layers is retained by selecting the etching conditions wherein the resist patterns 115, 113a to 113c are etched positively and side wall protective films 117a to 117c made of, as their main composition, CF polymers containing resist re-deposits (carbon) and fluorine in etching gas, are formed on the side walls of the polysilicon layers 20a to 20c. Since the resist patterns 115, 113a to 113c are etched, they become thin as shown in FIG. 23.

More specifically, parameters such as a pressure in an etching chamber, an RF power and a microwave power are adjusted to set an etching rate ratio of resist/polysilicon to 0.8 to 1.0. The lower electrode for holding a wafer is not necessary to be set to a low temperature. It is preferable that the pressure is set higher for low pressure high density plasma, the Rf power is set higher, and the microwave power is set slightly higher (not set too high).

Figure 43:
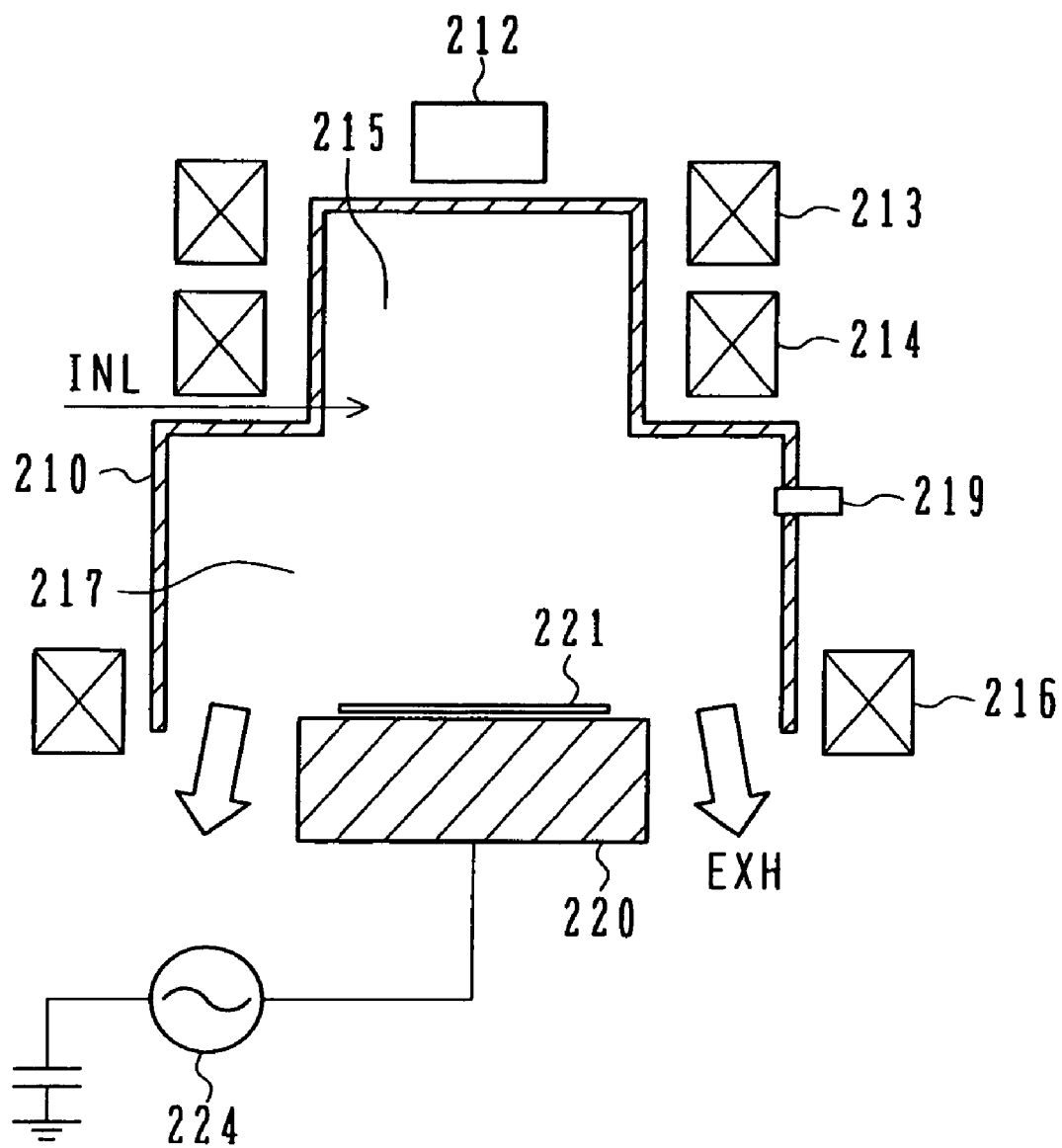
FIG. 43 is a schematic diagram of the structure of a plasma etching system.

FIG. 43 schematically shows the structure of a plasma etching system. An etching chamber 210 defines an upper plasma generating section 215 and a lower etching section 217. A first and a second main coils 213 and 214 surround the plasma generating section 215. A gas inlet or inlets INL are provided at the plasma generating section 215 under the second main coil 214. The top portion of the chamber 210 is formed of microwave transmitting material such as ceramics to form a microwave window. A microwave source 212 is positioned above the top plane. A magnetic field adjusting coil 216 surrounds the etching section to adjust the magnetic field in the etching section 217. A wafer susceptor 220 for suscepting a wafer 221 is vertically movable and contains a temperature controller and a lower electrode connected to a RF source of 13.56 MHz. The lower portion of the etching section is connected to an evacuating exhaust system. An end point monitor 219 monitors the light emission from the etched object.

For example, if a high density plasma dry etching system equipped with an electron cyclotron resonance (ECR) plasma source is used, the etching conditions are:

Source gases: $Cl_2/O_2/SF_6$
Gas flow rate: $Cl_2:O_2:SF_6$=10:1 to 2:0.1 to 2.0 (preferably 0.8 to 1.2)
RF power: 60 to 80 W (high ion energy)
Microwave power: 1000 to 1400 W (middle plasma density)
Pressure: 3 to 8 mTorr (high pressure for high density plasma source)
Main coil 1 current: 35 A
Main coil 2 current: 35 A
Magnetic field adjusting coil current: 10 A
wafer holding lower electrode temperature: 10 to 20° C.
Automatic end detection The high density plasma dry etching system of an inductive coupling plasma (ICP) type, a helicon wave type or the like may be used.

The above-described anisotropic etching can form the side walls of the polysilicon layers 20a and 20c having generally vertical shapes, in the broad space area shown in FIG. 23. In the narrow space area, the lower portions of the polysilicon layers 20a to 20c have skirt shapes and at the bottoms there are etching residues. These skirt shapes and etching residues can be removed by the succeeding over-etch. In the plasma etching process shown in FIG. 23, since $SF_6$ gas is added to the $Cl_2/O_2$ mixed gas series, the etching rate of the polysilicon layer increases and the process time per wafer can be shortened so that productivity can be improved.

(3) In succession, by using the resist layers 115, 113a to 113c by a mask, the polysilicon layers 20a to 20c are over-etched by plasma etching. Namely, the $SF_6$ gas flow rate of the above-described plasma etching is set to 0, the gas series is changed to the $Cl_2/O_2$ mixed gas series and the RF power is slightly lowered to slow the etching rate. Under these etching conditions, the over-etch is performed to remove the etching residues and skirt shapes in the lower portions of the polysilicon layers in a relatively narrow opening space area (an area having an aspect ratio of 1.0 or larger [an area having an opening space of 3.0 µm or smaller at a thickness of 3.0 µm of the polysilicon layers 20a to 20c]) to thereby change the anisotropic shape of the polysilicon layers 20a to 20c shown in FIG. 24.

For example, if the over-etching is performed by using the high density plasma etching system used for the main etching, the etching conditions are:

Source gases: $Cl_2/O_2$
Gas flow rate: $Cl_2:O_2$=10: 0.1 to 2.0 (preferably 0.8 to 1.2)
RF power: 30 to 60 W (lower ion energy than that of main etching)
Microwave power: 1000 to 1400 W (middle plasma density)
Pressure: 3 to 8 mTorr (high pressure for high density plasma source)
Main coil 1 current: 35 A
Main coil 2 current: 35 A
Magnetic field adjusting coil current: 10 A
wafer holding lower electrode temperature: 10 to 20° C.

It is preferable to reduce the $O_2$ flow rate more than that of the main etching. This is because since $O_2$ is supplied also from the silicon oxide film 16 as the underlying film, an excessive supply of $O_2$ is suppressed to prevent the etched shape from being degraded.

Figure 24:
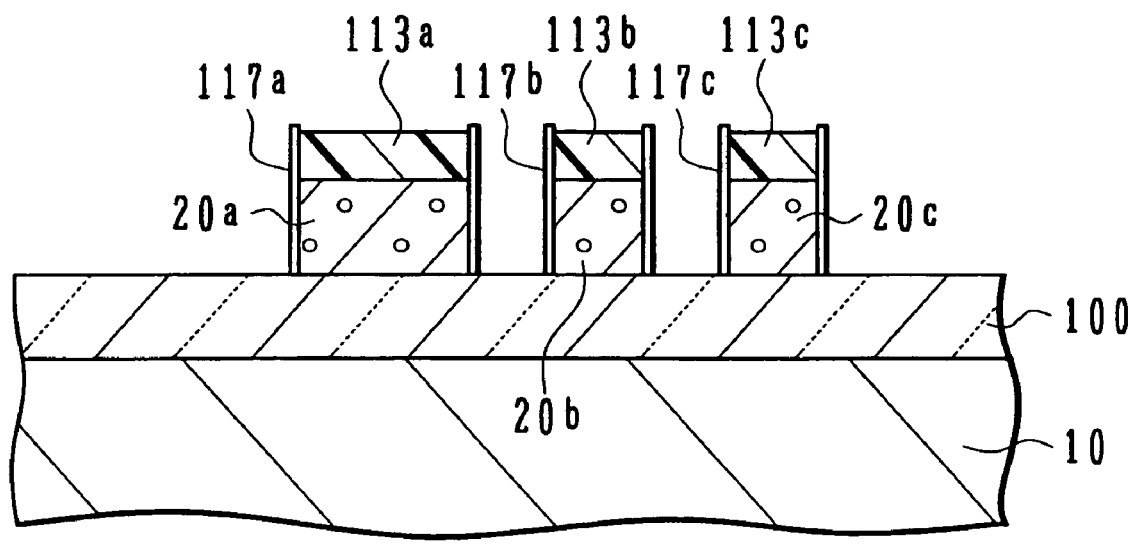

With the above-described over-etch, the side walls of the polysilicon layers 20a to 20c can have vertical shapes, as shown in FIG. 24. Notches are not formed on the side walls of the polysilicon layers 20a to 20c and it is possible to have some margin of the remaining amount of the resist patterns 113a to 113c.

Figure 25:
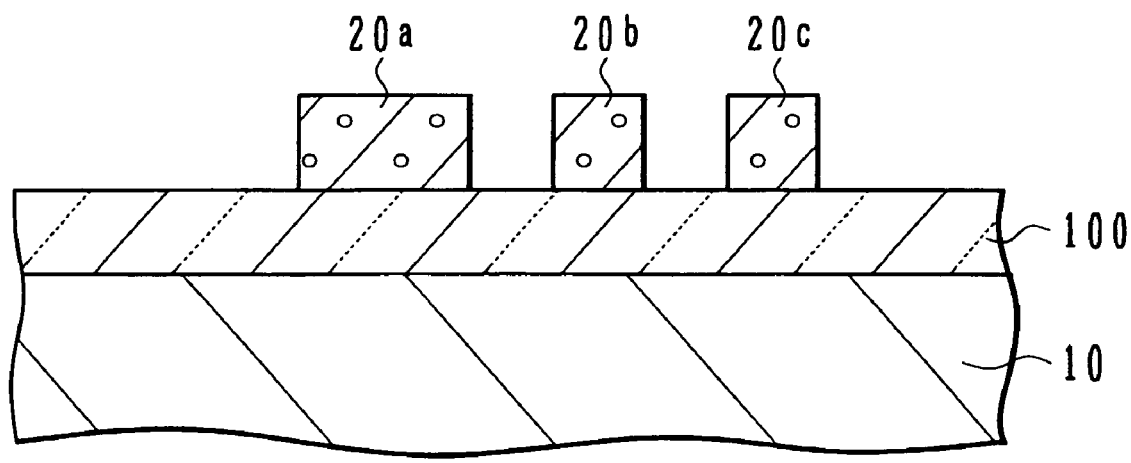
Figure 28:
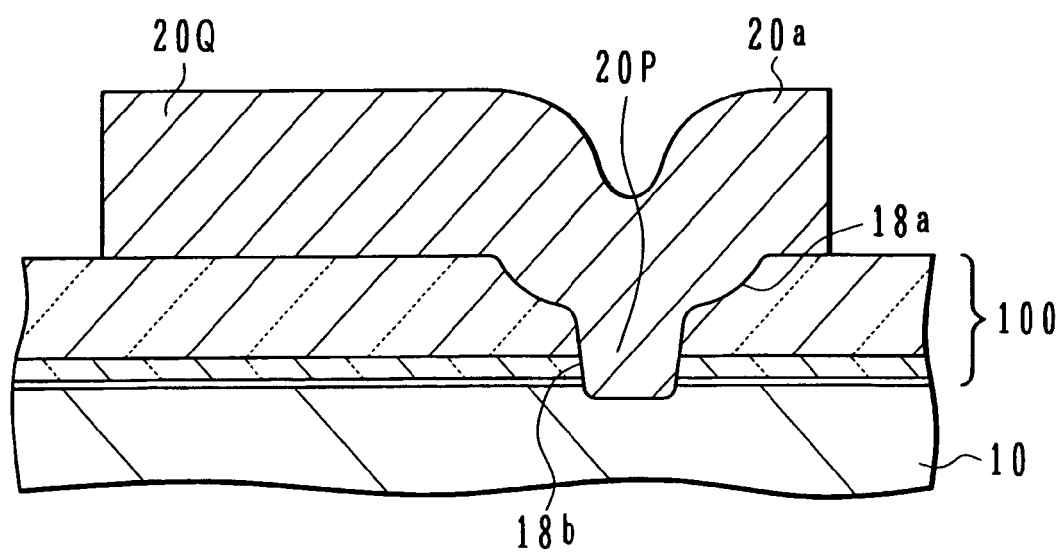
FIGS. 28 and 29 are cross sectional views corresponding to the cross sectional view shown in FIG. 27, illustrating a process of removing a resist layer and a side wall protective film.
Figure 29:
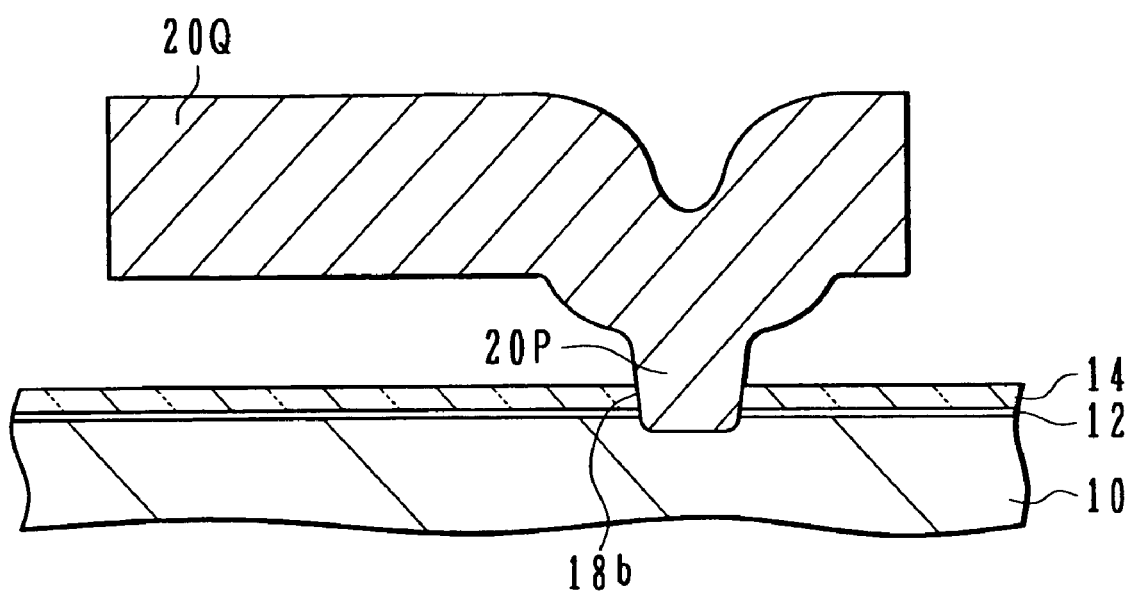

(4) Next, the remaining portions of the resist patterns 115, 113a to 113c and the remaining portion of the side wall protective films 117a to 117c are removed by a buffered hydrofluoric acid process and a combination of sulfuric acid and hydrogen peroxide washing process as shown in FIG. 25. FIG. 28 shows the polysilicon layer 20a. The polysilicon layer 20a has a connection portion 20P connected to the substrate 10 via the via holes 18a and 18b and an extension portion 20Q being continuous with the upper region of the connection portion and extending on the insulating film 100. The above-described annealing process may be executed after the removal process shown in FIG. 25. In the process shown in FIG. 29, the insulating film (sacrificial film) 16 is removed by wet etching. During this process, the insulating film 14 functions as the etching stopper film. The polysilicon layer 20a enters the state that it has the connection portion 20P connected to the substrate 10 via the via hole 18b and the extension portion 20Q being continuous with the connection portion and spaced from and extending above the surface of the insulating film 14 in a floating state.

The conductive member 20a of the micro structure shown in FIG. 28 may be used as a fixed electrode or wiring line. The conductive member 20a of the micro structure shown in FIG. 29 may be used as a movable electrode of a cantilever type. A connection portion similar to the connection portion 20P may be formed at the other end to form a movable electrode of a both-end fixed beam type.

According to the above-described micro structure manufacture method, the anisotropic etching process shown in FIG. 23 can work the thick silicon layer 20a having a thickness of 1 to 15 μm to have the anisotropic shape with a good size precision. Since the etching rate is fast, the productivity can be improved. The over-etch process shown in FIG. 24 can make the better anisotropic shapes of the polysilicon layers 20a to 20c. The removal process shown in FIG. 25 can easily remove the resist patterns 113a to 113c and side wall protective films 117a to 117c. It is therefore possible to manufacture a micro structure at a low cost without using new facilities.

Figure 35:
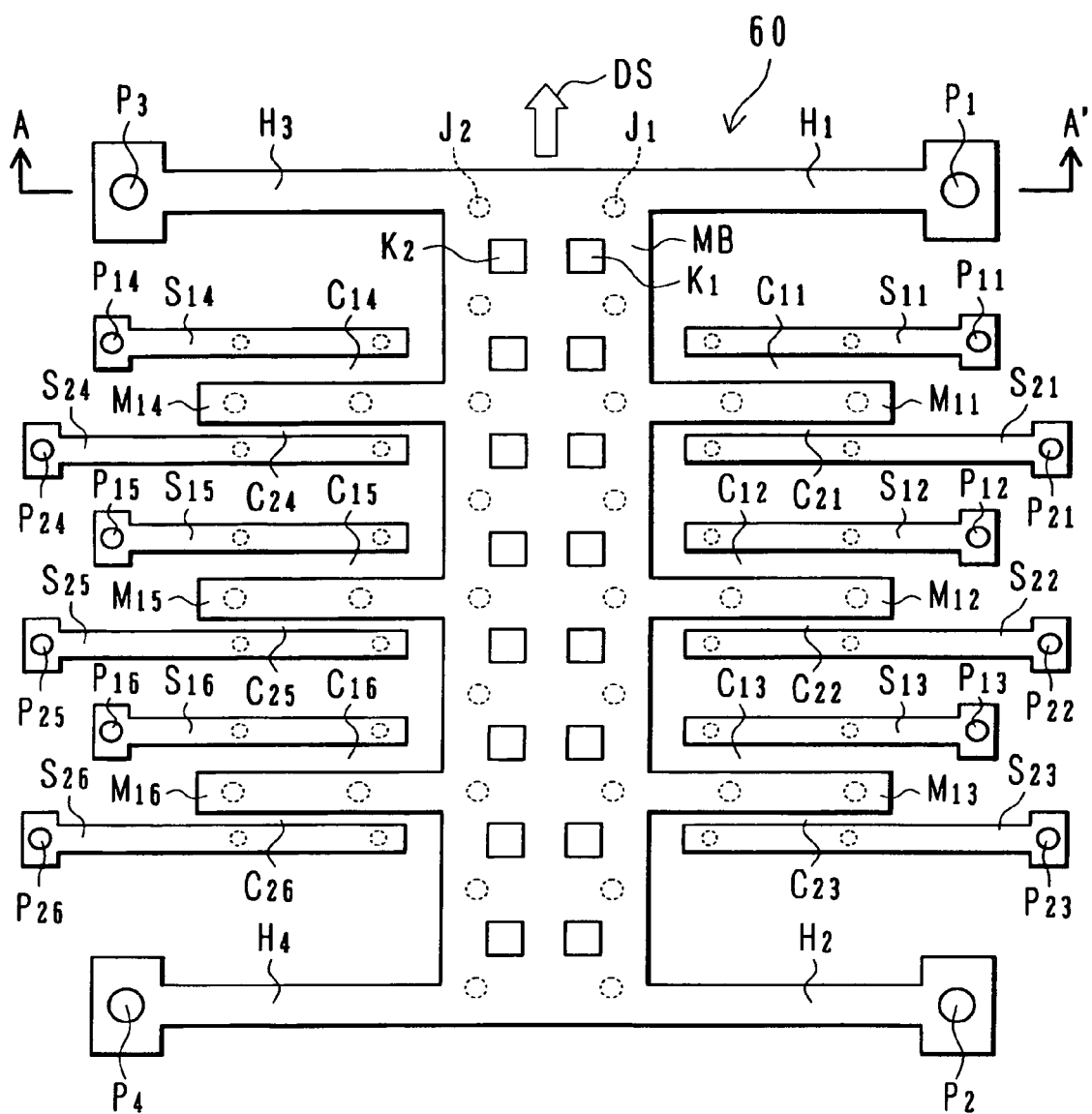
FIG. 35 is a top view of an electrostatic capacitor type acceleration sensor as an application example of a micro structure.
Figure 36:
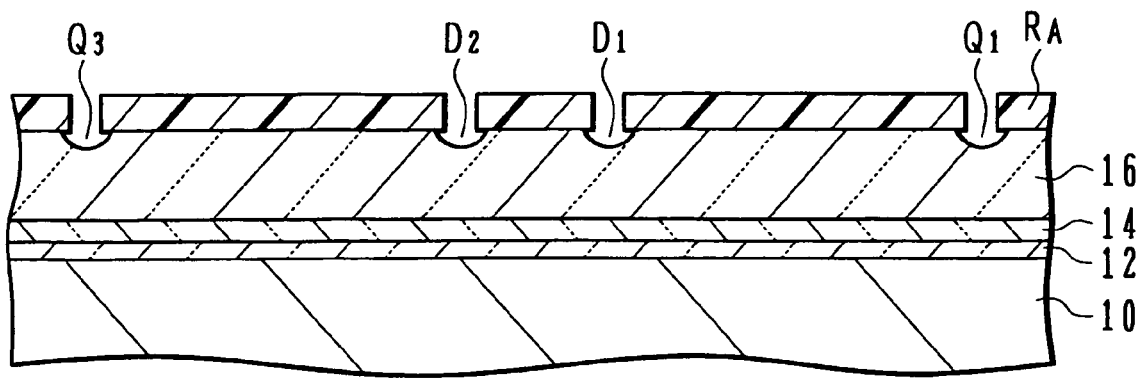
FIGS. 36 to 41 are cross sectional views illustrating main processes of a manufacture method for the acceleration sensor shown in FIG. 35.

FIG. 35 is a top view of an electrostatic capacitor type acceleration sensor 60 as an application example of a micro structure, the acceleration sensor being formed on one principal surface (substrate surface) of a semiconductor substrate. A cross sectional view taken along line A-A' in FIG. 35 is shown in FIG. 41. FIGS. 36 to 41 are cross sectional views illustrating main processes of a manufacture method for the acceleration sensor 60, the method being described later. In FIGS. 35 to 41, like elements to those shown in FIGS. 1 to 6 are represented by identical reference numerals and symbols and the detailed description thereof is omitted.

In the acceleration sensor 60, an elongated movable member MB serving as a mass body providing a weight function is mounted on a substrate surface by support members $H_1$ to $H_4$ in a both-end fixed beam manner so that the movable member MB can be displaced along a predetermined direction DS parallel to the substrate surface. The support members $H_1$ to $H_4$ are fixed to the substrate surface by connection portions $P_1$ to $P_4$.

Movable electrodes $M_{11}$ to $M_{13}$ are formed on one side of the movable member MB and movable electrodes $M_{14}$ to $M_{16}$ are formed on the other side of the movable member MB, respectively protruding along a direction parallel to the substrate surface. All the movable electrodes $M_{11}$ to $M_{16}$ protrude along a direction perpendicular to the longitudinal direction of the movable member MB, the protruding length of each movable electrode is equal and the width of each movable electrode is equal.

The movable member MB, support members $H_1$ to $H_4$, connection portions $P_1$ to $P_4$ and movable electrodes $M_{11}$ to $M_{16}$ are integrally formed by conductive polysilicon. On the bottom surface of the movable member MB (on the surface opposing the substrate surface), protrusions $J_1$ and $J_2$ for sticking protection are disposed spaced apart from each other. On the bottom surface of the movable member MB, seven pairs of protrusions similar to the protrusions $J_1$ and $J_2$ are juxtaposed along the longitudinal direction of the movable member MB. On the bottom surface of each of the movable electrodes $M_{11}$ to $M_{16}$, a pair of protrusions similar to the protrusions $J_1$ and $J_2$ is formed. As the protrusions including $J_1$ and $J_2$ are formed, the area of the bottom surfaces of the movable member MB and movable electrodes $M_{11}$ to $M_{16}$ which may contact the substrate surface can be reduced considerably. Therefore, even if the movable member MB and movable electrodes $M_{11}$ to $M_{16}$ are deformed by an external force and contact the substrate surface, they resume original positions when the external force is released. The sticking phenomenon can therefore be prevented.

Through holes $K_1$ and $K_2$ are formed through the movable member MB, and seven pairs of through holes similar to $K_1$ and $K_2$ are juxtaposed along the longitudinal direction of the movable member MB. These through holes help the insulating film under the movable member MB to be efficiently removed in the manufacture process to be later described.

Fixed electrodes $S_{11}$ and $S_{21}$ are formed on both sides of the movable electrode $M_{11}$, extending in parallel to the movable electrode $M_{11}$. The fixed electrodes $S_{11}$ and $S_{21}$ are fixed to the substrate surface by the connection portions $P_{11}$ and $P_{21}$, respectively. A distance between the movable electrode $M_{11}$ and fixed electrode $S_{11}$ is set longer than a distance between the movable electrode $M_{11}$ and fixed electrode $S_{21}$. The movable electrode $M_{11}$ and fixed electrode $S_{11}$ constitute an electrostatic capacitance $C_{11}$ and the movable electrode $M_{11}$ and fixed electrode $S_{21}$ constitute an electrostatic capacitance $C_{21}$. As the movable member MB displaces along the predetermined direction DS by an acceleration, the value of the electrostatic capacitance $C_{11}$ increases, whereas the value of the electrostatic capacitance $C_{21}$ reduces.

In the manner similar to the description of the movable electrode $M_{11}$, fixed electrodes $S_{12}$ and $S_{22}$ are formed on both sides of the movable electrode $M_{12}$, and constitute electrostatic capacitances $C_{12}$ and $C_{22}$. Similarly, fixed electrodes $S_{13}$ and $S_{23}$ are formed on both sides of the movable electrode $M_{13}$, and constitute electrostatic capacitances $C_{13}$ and $C_{23}$. Similarly, fixed electrodes $S_{14}$ and $S_{24}$ are formed on both sides of the movable electrode $M_{14}$, and constitute electrostatic capacitances $C_{14}$ and $C_{24}$. Similarly, fixed electrodes $S_{15}$ and $S_{25}$ are formed on both sides of the movable electrode $M_{15}$, and constitute electrostatic capacitances $C_{15}$ and $C_{25}$. Similarly, fixed electrodes $S_{16}$ and $S_{26}$ are formed on both sides of the movable electrode $M_{16}$, and constitute electrostatic capacitances $C_{16}$ and $C_{26}$.

The fixed electrodes $S_{12}$ to $S_{16}$ and $S_{22}$ to $S_{26}$ are fixed to the substrate surface by connection portions $P_{12}$ to $P_{16}$ and $P_{22}$ to $P_{26}$. Each fixed electrode such as $S_{11}$ is made of, for example, conductive polysilicon and has a cantilever structure. On the bottom surface of each fixed electrode, protrusions for sticking protection similar to $J_1$ and $J_2$ are formed as indicated by broken line circles in FIG. 35. The mass of each fixed electrode is negligible relative to the mass of the movable member MB so that each fixed electrode will not substantially displace in the range of an acceleration measured by a displacement of the movable member MB.

As the movable member MB displaces toward the DS direction, the electrostatic capacitances $C_{11}$ to $C_{16}$ increase and the electrostatic capacitances $C_{21}$ to $C_{26}$ reduce. An electrostatic capacitance change rate $R=(C_{11}+C_{12}+C_{13}+C_{14}+C_{15}+C_{16})/(C_{21}+C_{22}+C_{23}+C_{24}+C_{25}+C_{26})$ changes with an input acceleration. By calculating the electrostatic capacitance change rate R, the input acceleration can be measured.

Next, with reference to FIGS. 36 to 41, description will be made on an example of a method of manufacturing the acceleration sensor 60. In the process shown in FIG. 36, similar to the description previously made with reference to FIG. 1, insulating films 12, 14 and 16 are formed covering one principal surface of a semiconductor substrate 10 and thereafter, a resist pattern $P_A$ is formed on the insulating film 16 by photolithography. The resist pattern $R_A$ has openings corresponding to via holes $Q_1$ and $Q_3$ and recesses $D_1$ and $D_2$. Similar to the description previously made with reference to FIG. 2, the via holes $Q_1$ and $Q_3$ and recesses $D_1$ and $D_2$ are formed in the insulating film 16 by isotropic etching using the resist pattern $R_A$ as a mask. The via holes $Q_1$ and $Q_3$ correspond to the connection portions $P_1$ and $Q_3$ and the recesses $D_1$ and $D_2$ correspond to the protrusions $J_1$ and $J_2$. The resist pattern $R_A$ is thereafter removed.

Figure 37:
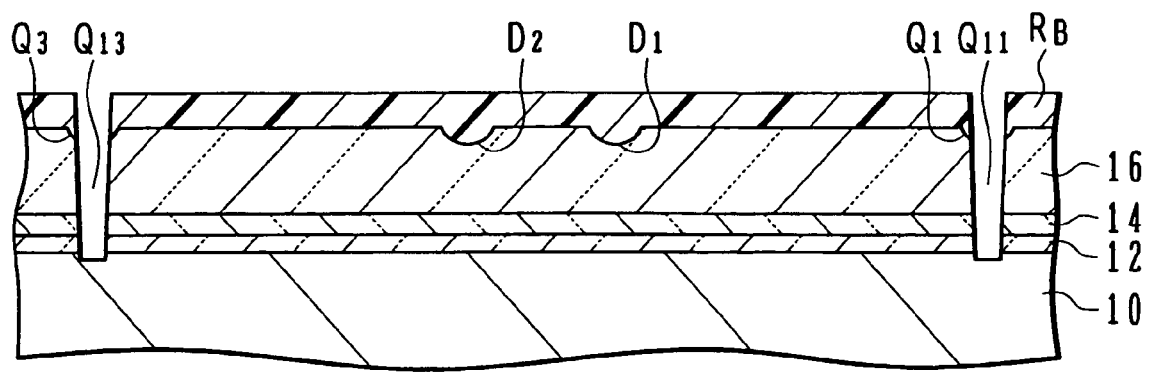

Next, in the process shown in FIG. 37, a resist pattern $R_B$ having openings corresponding to the via holes $Q_1$ and $Q_3$ is formed on the insulating film 16 by photolithography. The resist pattern RB covers the recesses $D_1$ and $D_2$ and exposes the central areas of the via holes $Q_1$ and $Q_3$. Via holes $Q_{11}$ and $Q_{13}$ continuous with the via holes $Q_1$ and $Q_3$ are formed by anisotropic etching using the resist pattern $R_B$ as a mask, the via holes $Q_{11}$ and $Q_{13}$ reaching the substrate 10. The resist pattern $R_B$ is thereafter removed.

Figure 38:
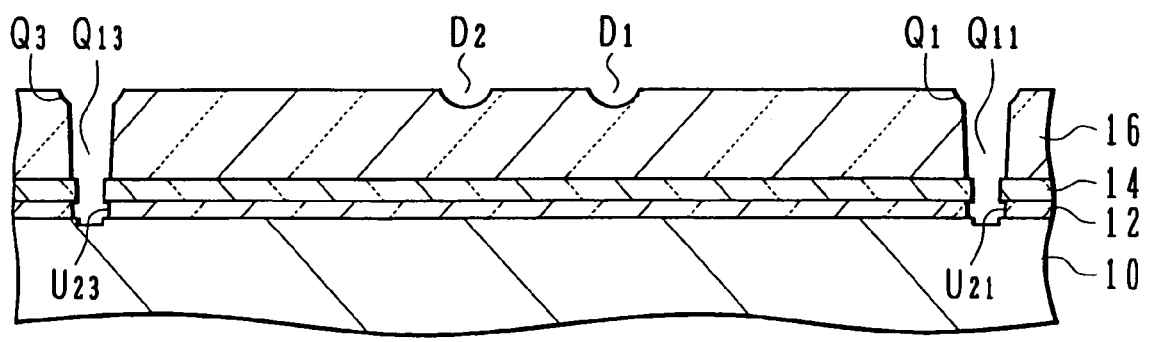

In the process shown in FIG. 38, similar to the description previously made with reference to FIG. 3, undercuts $U_{21}$ and $U_{23}$ are formed under the insulating film 14 by isotropic wet etching to increase the size of the via holes $Q_{11}$ and $Q_{13}$. After the wet etching, the substrate 10 is subjected to a drying process.

Figure 39:
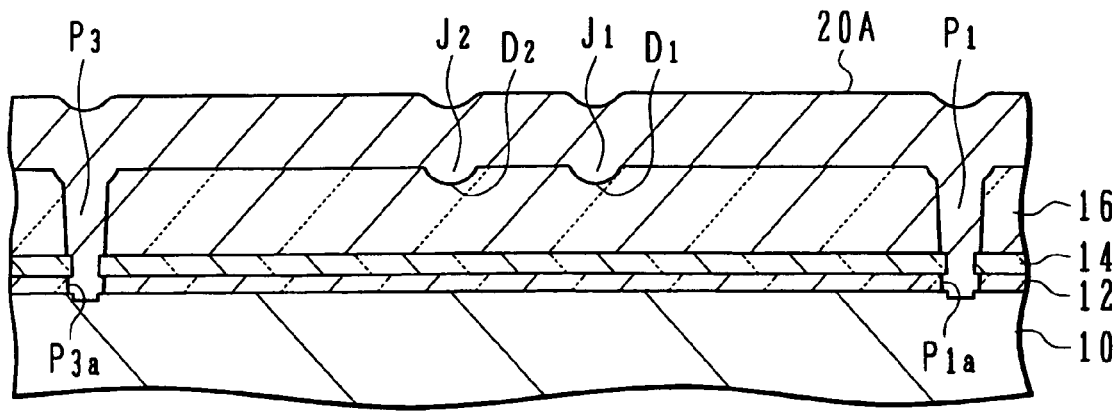

In the process shown in FIG. 39, similar to the description previously made with reference to FIG. 4A, a conductive polysilicon layer 20A is formed on the insulating film 16, burying the via holes $Q_1, Q_3, Q_{11}, Q_{13}$ and recesses $D_1$ and $D_2$. The protrusions $J_1$ and $J_2$ made of polysilicon and corresponding to the recesses $D_1$ and $D_2$ and the connection portions $P_1$ and $P_3$ corresponding to the via holes $Q_1$ and $Q_{11}$ and via holes $Q_3$ and $Q_{13}$ are therefore formed. Both the connection portions $P_1$ and $P_3$ are made of polysilicon and have interlock portions $P_{1a}$ and $P_{3a}$ corresponding to the undercuts $U_{21}$ and $U_{23}$.

Figure 40:
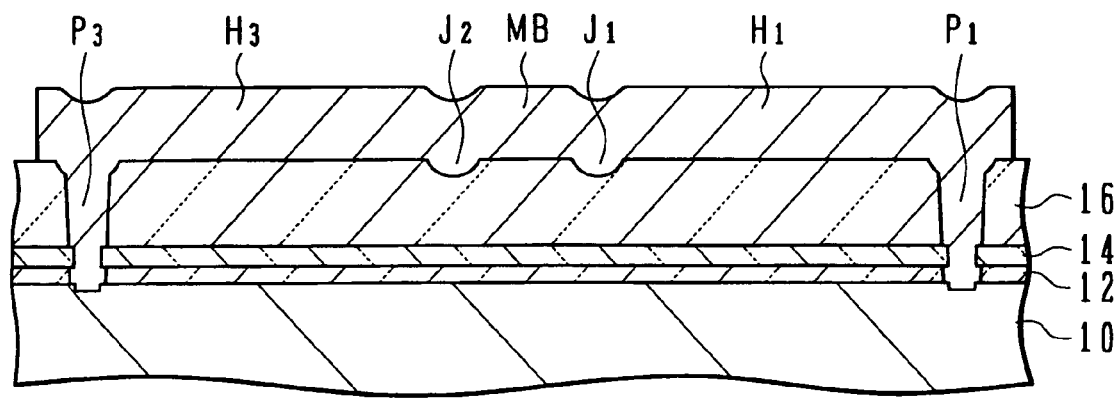
Figure 41:
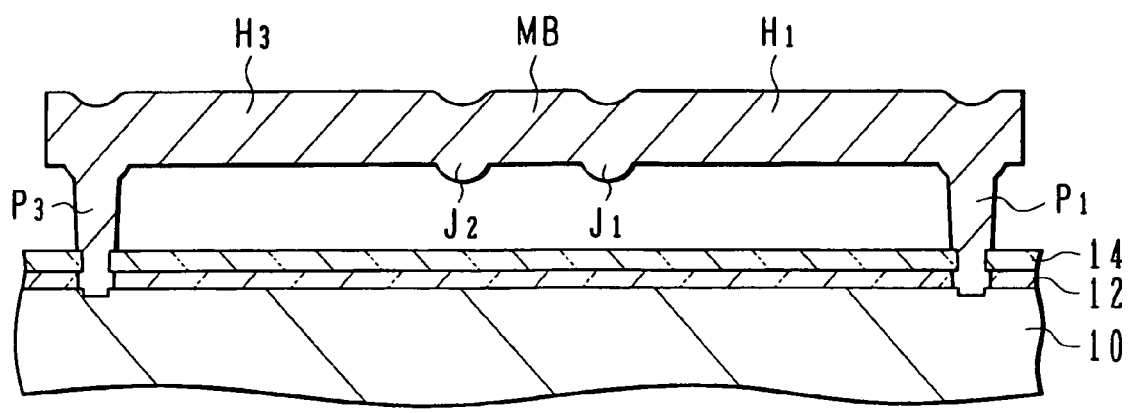

In the process shown in FIG. 40, similar to the description previously made with reference to FIG. 5, the polysilicon layer 20A is patterned by selective etching to obtain the movable member MB having the support members $H_1$ and $H_3$, connection portions $P_1$ and $P_3$ and protrusions $J_1$ and $J_2$. In this patterning process, a number of through holes such as $K_1$ and $K_2$ are formed through the movable member MB.

In the process shown in FIG. 41, similar to the description previously made with reference to FIG. 6, the insulating film 16 is removed by wet etching to make the movable member MB in a floating state. During this process, wet etchant enters the through holes such as $K_1$ and $K_2$. The through holes such as $K_1$ and $K_2$ help the insulating film 16 under the movable member MB to be efficiently removed. The protrusions such as $J_1$ and $J_2$ help the movable member MB and the like to be prevented from sticking during the manufacture processes. A portion of the insulating film 16 may be left under each fixed electrode such as $S_{11}$ shown in FIG. 35 to dispose each fixed electrode on the insulating film as shown in FIG. 5.

In the manufacture method described with reference to FIGS. 36 to 41, although the interlock structure of the connection portions $P_1$ and $P_3$ adopts the structure shown in FIG. 6, the structure shown in FIG. 11 may be adopted. The substrate having at least one insulating principal surface such as shown in FIG. 13 may be used, a sensor circuit and the like described with reference to FIGS. 13 to 15 may be fabricated on the same substrate to make an IC including the acceleration sensor 60.

In the embodiment of FIGS. 35-41, the movable electrode was made of a bridge-shaped electrode, and the stable electrode was made of a cantilever electrode. The movable electrode may also be made of a cantilever electrode, and the stable electrode may also be made of a solid electrode on an underlying support, or a bridge-shaped electrode. Also, such sensors as angular velocity sensor, gyro sensor, vibration sensor (microphone) can be formed. In the case of vibration sensor, etc., movement in the vertical direction may be sensed. The present invention has been described in connection with the preferred embodiments. The invention is not limited only to the above embodiments, but various modifications may be made. For example, the following modifications are possible.

(1) The material of the conductive member 20, 20A is not limited to polysilicon, but other materials may be used including amorphous silicon, polysilicon or amorphous silicon doped with germanium, carbon or the like, refractory metal such as titanium and tungsten, aluminum, aluminum alloy, copper and the like. The material of the conductive member 20, 20A may be hard metal such as W, Ta, Hf, Ti, Mo, Fe, Co, Cr and Ni. Ge, Si-Ge may also be used. Metal or its alloy having a density of 10 $g/cm^3$ or higher such as W, Ta and Hf has a large moment of inertia even if it has a small size, so that this material is effective for miniaturization, high integration and compact sensors. The material having a density of 3 to 9 $g/cm^3$ (although the density is smaller than the above-described material, it has a larger density than that of polysilicon) has a small moment of inertia so that a high sensitivity sensor can be formed. Since the density of polysilicon is as smaller as 2.4 $g/cm^3$, a high sensitivity sensor capable of detecting a very small value can be formed. The density of Ti and Ge is about 5.3 $g/cm^3$ and the density of Si—Ge is an intermediate value of 2.4 to 5.3 $g/cm^3$. From the other viewpoint, since Ti, Si, Si—Ge and Ge are often used as the wiring material of a semiconductor device, presently used processes can be incorporated without any contamination. Stainless steel and chromium molybdenum steel have excellent durability and oxidation resistance. 42 alloy (Fe—Ni alloy) has a thermal expansion coefficient generally equal to that of a silicon substrate so that the sensor sensitivity is not dependent upon temperature characteristic and is resistant to thermal stress, similar to using Si, Si—Ge or Ge.

(2) The material of the sacrificial film is not limited to silicon oxide, but resist, polyimide resin, spin-on-glass (SOG) and the like may be used. Since resist and polyimide is soluble to organic solvent, there is no damage to a conductive member such as an underlying insulating film and polysilicon and resist and polyimide are particularly useful if aluminum likely to be melted by heating or alloy containing copper is used as the material of the conductive member. SOG, particularly inorganic SOG and silsesquioxane SOG have a fast etching rate so that a process time is shortened and there is less damages to an underlying insulating film and conductive member.

(3) Although a silicon layer doped with impurities is etched, a non-doped silicon layer not doped with impurities may be etched.

(4) If germanium (Ge) or carbon (C) is contained in a silicon layer to be etched, the content of Ge is set to 1 to 30 mol % (preferably 5 to 15 mol %) and the content of C is set to 0.5 to 10 mol % (preferably 1 to 5 mol %).

(5) Fluorine-containing gas is not limited to $SF_6$, but $CHF_3$, $CF_4$, $C_2F_6$, $C_3F_8$, $C_4F_8$ or the like may also be used.

(6) A polysilicon layer to be etched may be formed not on a silicon substrate but on an insulating substrate.

It will be apparent to those skilled in the art that other various modifications, improvements, combinations, and the like can be made.

What we claim are:

1. A micro structure comprising:
   a semiconductor substrate;
   at least a first layer having a via hole and formed on said semiconductor substrate;

the via hole comprising an interlock structure formed on a side wall of said via hole and having a retracted portion retracted from inside of said via hole and a protruded portion protruding toward the inside of said via hole above the retracted portion; and a conductive member formed of a continuous single material body, and having at one end a connection portion burying said via hole and an extension portion continuous with said connection portion and extending along a direction parallel to a surface of said semiconductor substrate, the conductive member continuously extending from the connection portion to the extension portion without forming any interface therein.

2. The micro structure according to claim 1, wherein the first layers comprises an insulating film.

3. The micro structure according to claim 2, wherein said insulating film includes a lower layer including said retracted portion and an upper layer including said protruded portion.

4. The micro structure according to claim 3, wherein said connection portion has a projection projecting outward from said via hole above said upper layer.

5. The micro structure according to claim 3, wherein said upper and lower layers are made of different materials.

6. The micro structure according to claim 2, wherein said retracted portion is formed in said semiconductor substrate.

7. The micro structure according to claim 2, wherein said semiconductor substrate includes an impurity doped region and said via hole reaches a surface of said impurity doped region.

8. The micro structure according to claim 2, wherein said extension portion is in a floating state over said insulating film.

9. The micro structure according to claim 8, further comprising another conductive member fixed to said semiconductor substrate, and facing said conductive member.

10. The micro structure according to claim 8, wherein said extension portion has a protrusion on a bottom surface, said protrusion preventing sticking of the extension portion.

11. The micro structure according to claim 2, wherein said insulating film has another via hole, said other via hole has another interlock structure of a same kind as said interlock structure, said conductive member has another connection portion formed burying said other via hole, and said extension portion is connected by said connection portion and said another connection portion.

12. The micro structure according to claim 11, wherein said extension portion is in a floating state over said insulating film.

13. The micro structure according to claim 12, further comprising another conductive member fixed to said semiconductor substrate, and facing said conductive member.

14. The micro structure according to claim 12, wherein said extension portion has a protrusion on a bottom surface, said protrusion preventing sticking of the extension portion.

15. The micro structure according to claim 2, wherein said semiconductor substrate has an insulating surface and the micro structure further comprises a conductive layer disposed between said insulating surface and said insulating film.

16. The micro structure according to claim 15, wherein said insulating film includes a lower layer including said retracted portion and an upper layer including said protruded portion.

17. The micro structure according to claim 16, wherein said connection portion has a projection projecting outward from said via hole above said upper layer.

18. The micro structure according to claim 3, wherein said insulating film includes a repetition of a stack of said lower and upper layers.

19. The micro structure according to claim 2, wherein said conductive member is made of silicon which contains impurities at a mol ratio of 0.05 to 0.2 relative to silicon.

20. The micro structure according to claim 2, wherein said conductive member is made of silicon which contains Ge or C.

* * * * *